(12) United States Patent
Itaya et al.

(10) Patent No.: US 8,243,465 B2
(45) Date of Patent: Aug. 14, 2012

(54) SEMICONDUCTOR DEVICE WITH ADDITIONAL POWER SUPPLY PATHS

(75) Inventors: Satoshi Itaya, Tokyo (JP); Satoshi Isa, Tokyo (JP); Mitsuaki Katagiri, Tokyo (JP); Dai Sasaki, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 0 days.

(21) Appl. No.: 12/707,996

(22) Filed: Feb. 18, 2010

(65) Prior Publication Data

US 2010/0208443 A1 Aug. 19, 2010

(30) Foreign Application Priority Data

Feb. 18, 2009 (JP) ................................ 2009-035546

(51) Int. Cl.
 *H01R 9/00* (2006.01)
 *H01L 23/02* (2006.01)
(52) U.S. Cl. ........ 361/772; 361/735; 361/780; 361/790; 361/301.4; 257/686
(58) Field of Classification Search .................. 361/783, 361/735, 780, 790, 301.4; 257/686
See application file for complete search history.

(56) References Cited

U.S. PATENT DOCUMENTS

| | | | | |
|---|---|---|---|---|
| 5,883,427 A * | 3/1999 | Arimoto | ........................ | 257/690 |
| 5,982,632 A * | 11/1999 | Mosley et al. | ................. | 361/775 |
| 6,005,778 A * | 12/1999 | Spielberger et al. | .......... | 361/770 |
| 6,060,772 A * | 5/2000 | Sugawara et al. | .............. | 257/678 |
| 6,137,168 A * | 10/2000 | Kirkman | ........................ | 257/691 |
| 6,214,638 B1* | 4/2001 | Banerjee | ......................... | 438/106 |
| 6,274,925 B1* | 8/2001 | Fazelpour | ....................... | 257/678 |
| 6,448,639 B1* | 9/2002 | Ma | .................................. | 257/691 |
| 6,472,747 B2* | 10/2002 | Bazarjani et al. | .............. | 257/724 |
| 6,545,367 B2* | 4/2003 | Sota | ................................ | 257/784 |
| 6,775,153 B2* | 8/2004 | Hashimoto | .................... | 361/803 |
| 7,557,646 B2* | 7/2009 | Nakatsu et al. | ................ | 327/565 |
| 7,879,655 B2* | 2/2011 | Tsutsumi et al. | .............. | 438/124 |
| 7,884,444 B2* | 2/2011 | Strzalkowski | ................. | 257/531 |
| 7,884,454 B2* | 2/2011 | Lu et al. | ......................... | 257/676 |
| 8,097,954 B2* | 1/2012 | Ozawa et al. | .................. | 257/777 |
| 2002/0027295 A1* | 3/2002 | Kikuma et al. | ................ | 257/780 |
| 2002/0041027 A1* | 4/2002 | Sugizaki | ......................... | 257/737 |
| 2003/0211655 A1* | 11/2003 | Cobbley et al. | ................ | 438/118 |
| 2004/0154956 A1* | 8/2004 | Cobbley et al. | ................ | 206/710 |

(Continued)

FOREIGN PATENT DOCUMENTS

JP 2003-332515 11/2003

(Continued)

*Primary Examiner* — Timothy Thompson
*Assistant Examiner* — Nathan Milakovich
(74) *Attorney, Agent, or Firm* — Young & Thompson

(57) ABSTRACT

A semiconductor device reduces the impedance of a wiring for supplying the circuit excluding a data output circuit with a power source voltage or a ground voltage and of speedup of data signal transmission in the data output circuit. Additional substrates 2a, 2b are on the upper surface of semiconductor chip 1. First additional wiring layer for power source 10d and first additional wiring layer for ground 10s formed on respective additional substrates 2a, 2b form prescribed conductive areas on semiconductor chip 1. First power source wiring 40C$_{1d}$ or first ground wiring 40C$_{1s}$ are interconnected through additional wiring layers 10d and 10s. Second power source wiring 40C$_{2d}$ and second ground wiring 40C$_{2s}$, which is extended in the same direction as with DQ system signal wiring 40C$_{DQ}$, forms a feedback current path. Second power source wiring 40C$_{2d}$ and second ground wiring 40C$_{2s}$ are disposed adjacent to DQ system signal wiring 40C$_{DQ}$.

15 Claims, 27 Drawing Sheets

U.S. PATENT DOCUMENTS

| | | | |
|---|---|---|---|
| 2004/0157373 A1* | 8/2004 | Cobbley et al. | 438/109 |
| 2004/0188854 A1* | 9/2004 | Konishi et al. | 257/777 |
| 2006/0076690 A1* | 4/2006 | Khandros et al. | 257/777 |
| 2006/0087013 A1* | 4/2006 | Hsieh | 257/678 |
| 2006/0118937 A1* | 6/2006 | Katagiri et al. | 257/686 |
| 2006/0208348 A1* | 9/2006 | Ohsaka et al. | 257/685 |
| 2006/0226529 A1* | 10/2006 | Kato et al. | 257/686 |
| 2007/0164446 A1* | 7/2007 | Hawk et al. | 257/778 |
| 2008/0081455 A1* | 4/2008 | Yu et al. | 438/612 |
| 2008/0164621 A1* | 7/2008 | Yamada et al. | 257/784 |
| 2008/0237645 A1* | 10/2008 | Uchino | 257/203 |
| 2009/0026628 A1* | 1/2009 | Lee et al. | 257/777 |
| 2009/0032973 A1* | 2/2009 | Sasaki et al. | 257/777 |
| 2009/0079092 A1* | 3/2009 | Liu et al. | 257/777 |
| 2009/0108467 A1* | 4/2009 | Otremba | 257/777 |
| 2009/0194857 A1* | 8/2009 | Liu et al. | 257/676 |
| 2009/0273096 A1* | 11/2009 | Hiew et al. | 257/777 |

FOREIGN PATENT DOCUMENTS

JP  2004-327757  11/2004

* cited by examiner

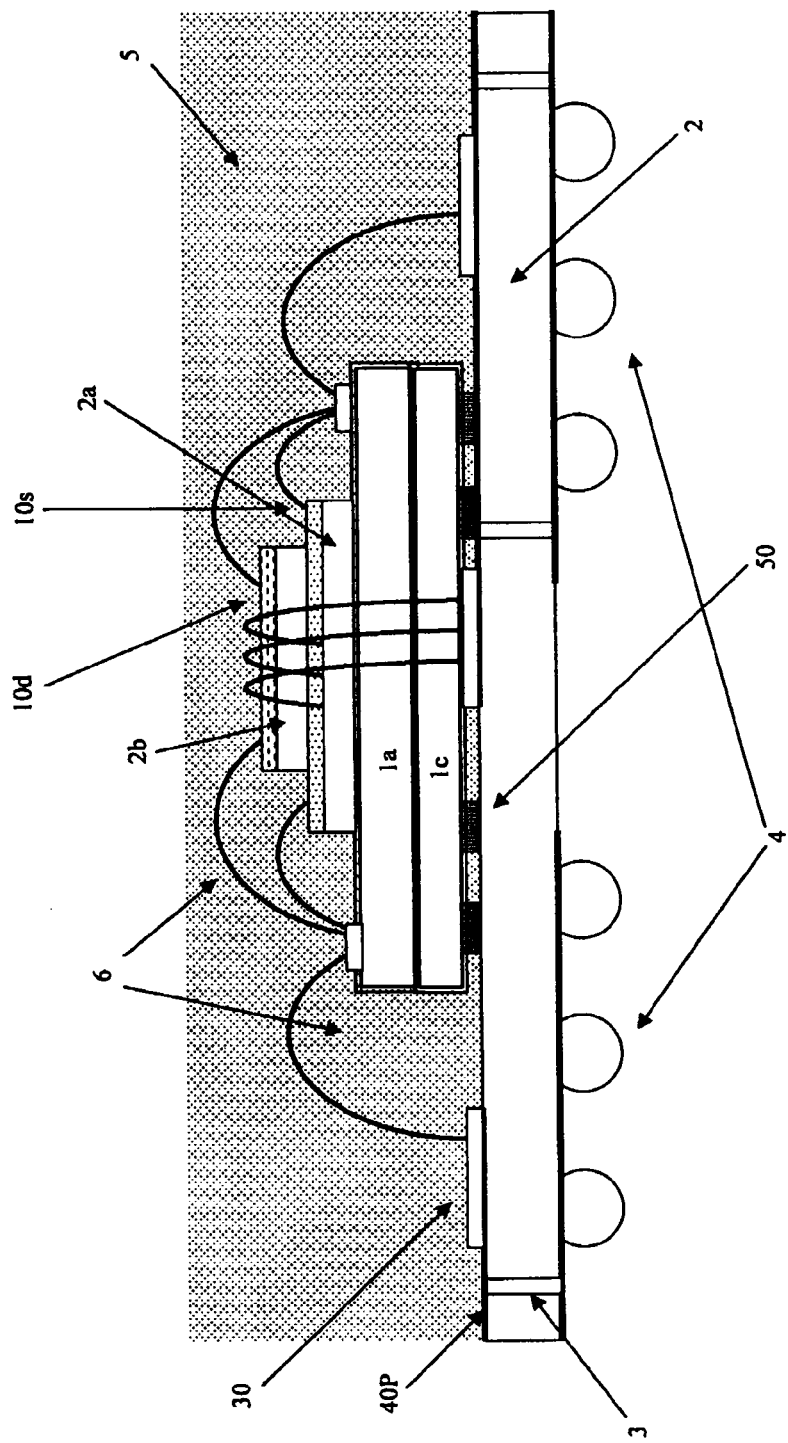

SEMICONDUCTOR DEVICE WITH ADDITIONAL POWER SUPPLY PATHS

This application is based upon and claims the benefit of priority from Japanese patent application No. 2009-35546, filed on Feb. 18, 2009, the disclosure of which is incorporated herein in its entirety by reference.

BACKGROUND OF THE INVENTION

1. Field of the Invention

The present invention relates to a semiconductor device including a power source wiring and a ground wiring.

2. Description of the Related Art

In recent years, a technique that reduces unevenness in the potential of electrode pads for a power source or in the potential of electrodes pads for a ground of the semiconductor chip has been utilized. This realizes a semiconductor device with increased electric properties. In such semiconductor device, for example, a power source voltage for the electrode pads for the power source is supplied from a common power source wiring in a package substrate, and a ground voltage for the electrode pads for the ground is supplied from a common ground wiring in the package substrate. This prevents unevenness in potential.

FIG. 1 is a schematic diagram showing a semiconductor chip and its peripherals in semiconductor device related to the present invention. FIG. 2 is a longitudinal sectional view of the semiconductor device shown in FIG. 1. FIG. 3 is a diagram showing a substrate wiring of the semiconductor device viewed from a side of semiconductor chip 201. FIG. 4 is a diagram showing the substrate wiring of the semiconductor device viewed from a side of external terminals 204. FIGS. 3 and 4 show external form 201a of the package.

In an example shown in FIGS. 1 to 4, pad row 220P including electrode pads 220 is formed on both sides of the upper surface of semiconductor chip 201 mounted on circuit board 202 and encapsulated by 205, with the circuit board 202 including conductive vias 203 connected to the external terminals 204 by way of conductive traces 240W.

There exists a plurality of types of power sources and grounds in the semiconductor device. These types of power sources and grounds include a second power source and ground system (VDDQ and VSSQ) for mainly providing a power source potential and a ground potential for a data output circuit, and a first power source and ground system (VDD and VSS) for mainly providing the power source potential and the ground potential for the circuit excluding the data output circuit.

In a configuration of the semiconductor device shown in FIG. 1, first power source pad $220Q_{1d}$ is included in pad rows 220P on both sides. Likewise, first ground pad $220Q_{1s}$ is included in pad rows 220P on both sides. That is, the potentials of the first power source and ground system (VDD and VSS) are supplied to a wide area on the semiconductor chip. Thus, pads for the first power source and ground system (VDD pad and VSS pad) on semiconductor chip 201 may be disposed on semiconductor chip 201 in a distributed manner.

On the other hand, second power source pad $220Q_{2d}$ and second ground pad $220Q_{2s}$ are disposed adjacent to DQ system signal pads $220Q_{DQ}$. More specifically, potentials of the second power source and ground system (VDDQ and VSSQ) are supplied adjacent to data input and output pads from the outside to the inside of the semiconductor chip. Thus, the pads for the second power source and ground system (VDDQ pad and VSSQ pad) are disposed adjacent to the data input and output pads (DQ pads) on the semiconductor chip.

Each of the pads and each of the connection lands 230 are connected to each other by bonding wire 206. A wiring runs from each connection land 230.

In the example shown in FIGS. 1 to 4, each pad and each connection land are directly connected by the bonding wire. On the other hand, a configuration where an additional wiring layer of a power source or a ground is provided on a semiconductor chip mounted on a circuit board is disclosed in Japanese Patents Laid-Open Nos. 2004-327757 and 2003-332515. Means disclosed in these documents for routing the power source wiring or the ground wiring using the additional wiring layer provided on the semiconductor chip is useful for reducing impedances of the power source wiring and the ground wiring on the circuit board.

However, if the means disclosed in Japanese Patent Laid-Open No. 2004-327757 or 2003-332515 is used for a semiconductor device mounted with a semiconductor chip such as a DRAM, a problem arises in which speedup of the signal transmission is prevented even though impedances of the power source wiring and the ground wiring on the circuit board are reduced.

Thus, inventors of the present invention have diligently studied this problem, and thereby found that the problem arises due to the following causes.

As described above, the power source and the ground externally supplied with the potential include the first power source and ground system (VDD and VSS) mainly supplying the circuit excluding the data output circuit with the power source potential and the ground potential, and the second power source and ground system (VDDQ and VSSQ) mainly supplying the data output circuit with the power source potential and the ground potential.

Among them, the potential of the first power source and ground system (VDD and VSS) is supplied to a wide area on the semiconductor chip. Thus, the pads for the first power source and ground system (VDD pad and VSS pad) may be disposed on the semiconductor chip in a distributed manner. On the semiconductor chip with the disposition of edge pads in two rows shown in FIG. 1, for example, the pads for the first power source and ground system are disposed in the pad rows on both sides. Thus, as shown in FIGS. 3 and 4, when first power source wiring $240C_{1d}$ and first ground wiring $240C_{1s}$ (first power source and ground system) are routed around semiconductor chip 201 on circuit board 202, the following problems arise. For example, when first power source wiring $240C_{1d}$ is routed as shown in FIG. 5, a problem occurs in which the wire routing involves a long distance. In addition, a problem unavoidable occurs in an area in which the width of the wire decreases, and further, there is an increase in the distance of the wire routing in order to keep the wire separate from each other. Therefore, the method of routing using the additional wiring layer as disclosed in Japanese Patent Laid-Open No. 2004-327757 or 2003-332515 is advantageous to the first power source and ground system because the impedance of the wiring can be reduced.

On the other hand, second power source pad $220Q_{2d}$ and second ground pad $220Q_{2s}$ are disposed adjacent to DQ system signal pad $220Q_{DQ}$. Bonding wires 206 are extended from respective pads so as to run parallel to each other. By thus matching the direction in which bonding wires 206 extended from second power source pad $220Q_{2d}$ and from second ground pad $220Q_{2s}$ with matching the direction in which bonding wires 206 are extended from DQ system signal pads $220Q_{DQ}$, the second power source and ground system forms a feedback current path of the output signal, thereby reducing switching noise owing to switching of the output circuit.

However, if the second power source and ground system wirings are routed on the additional wiring layer formed on the semiconductor chip, the direction in which bonding wires 206 are extended from second power source pad 220Q$_{2d}$ and second ground pad 220Q$_{2s}$ and the direction in which bonding wires 206 are extended from DQ system signal pads 220Q$_{DQ}$ become different from each other. As a result, the feedback current path of the output data signal by the second power source and ground system is distorted, and the effect of reducing switching noise decreases. That is, the switching noise increases and speedup of the signal transmission is prevented.

SUMMARY

The present invention seeks to solve one or more of the above problems, or to improve upon those problems at least in part.

A semiconductor device according to the present invention comprises: a circuit board; and a semiconductor chip mounted on the circuit board and includes a data output circuit and the circuit excluding the data output circuit. The circuit excluding the data output circuit is supplied with a first power source potential or a first ground potential from the circuit board over a first path that passes through a prescribed conductive area on the semiconductor chip. The data output circuit is supplied with a second power source potential or a second ground potential from the circuit board over a second path that passes a feedback current path of a data signal to be outputted to the circuit board from the data output circuit.

According to the present invention, the circuit excluding the data output circuit is supplied with the first power source potential or the first ground potential over the first path that passes through a prescribed conductive area on the semiconductor chip without routing the path around the semiconductor chip. Thus, the power source potential or the ground potential can be conducted through a wiring of a size that is close to that of a solid pattern and can be selected for the circuit excluding the data output circuit instead of a wiring routed around the semiconductor chip, and supplied over the linear path, thereby allowing the impedance of the wiring to be reduced. The data output circuit is supplied with the second power source potential or the second ground potential from the circuit board over the second path forming that forms the feedback current path. This reduces switching noise owing to switching of the output circuit, thereby enabling data signal transmission to be performed at higher speed.

BRIEF DESCRIPTION OF THE DRAWINGS

The above features and advantages of the present invention will be more apparent from the following description of certain preferred embodiments taken in conjunction with the accompanying drawings, in which:

FIG. 27 is a longitudinal sectional view of the semiconductor device according to an exemplary embodiment of the present invention.

DETAILED DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposes.

First Exemplary Embodiment

Next, an exemplary embodiment will be described with reference to the drawings.

Figure 6:
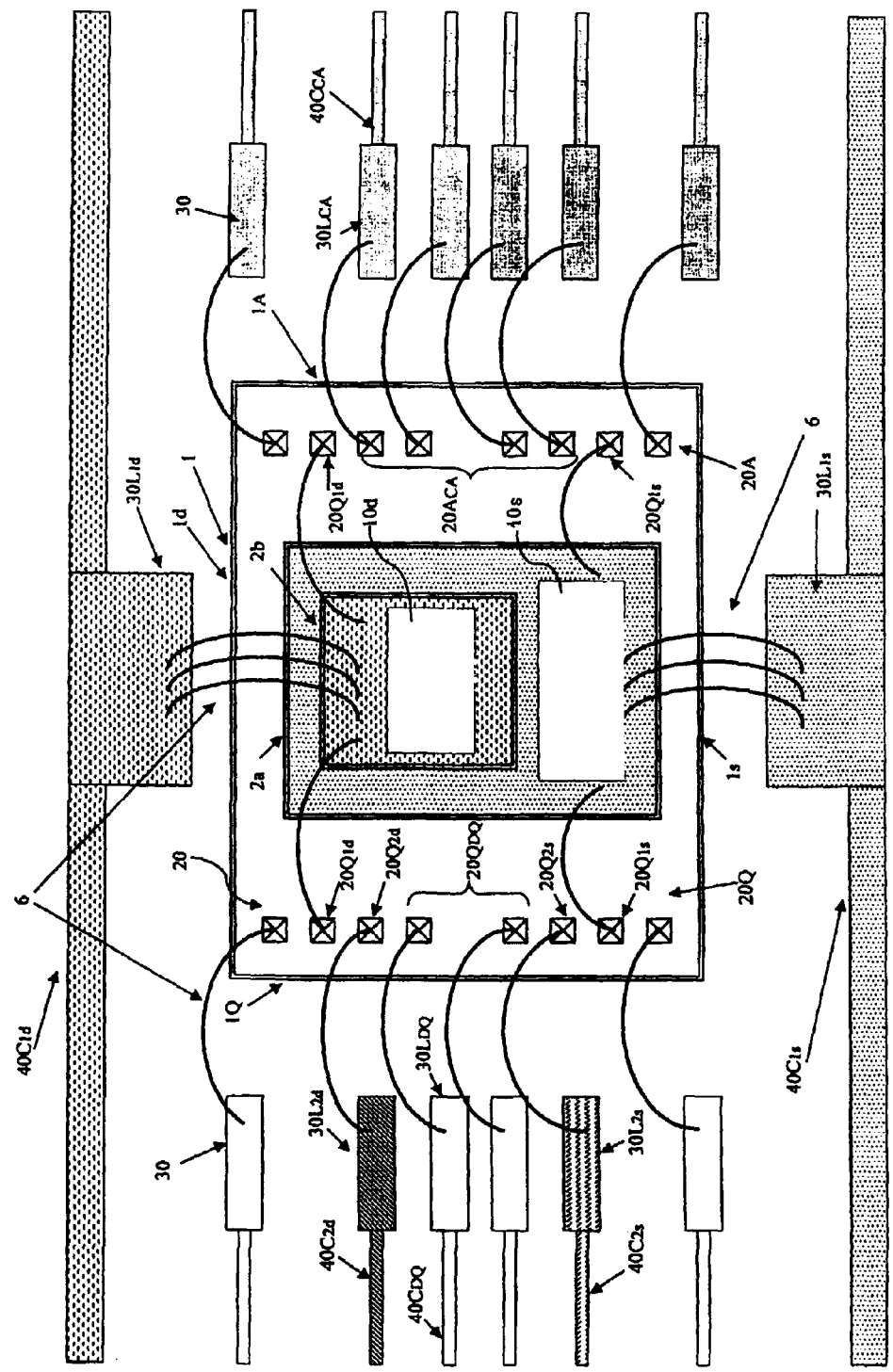
FIG. 6 is a schematic diagram showing a semiconductor chip of a semiconductor device according to an exemplary embodiment.
Figure 7:
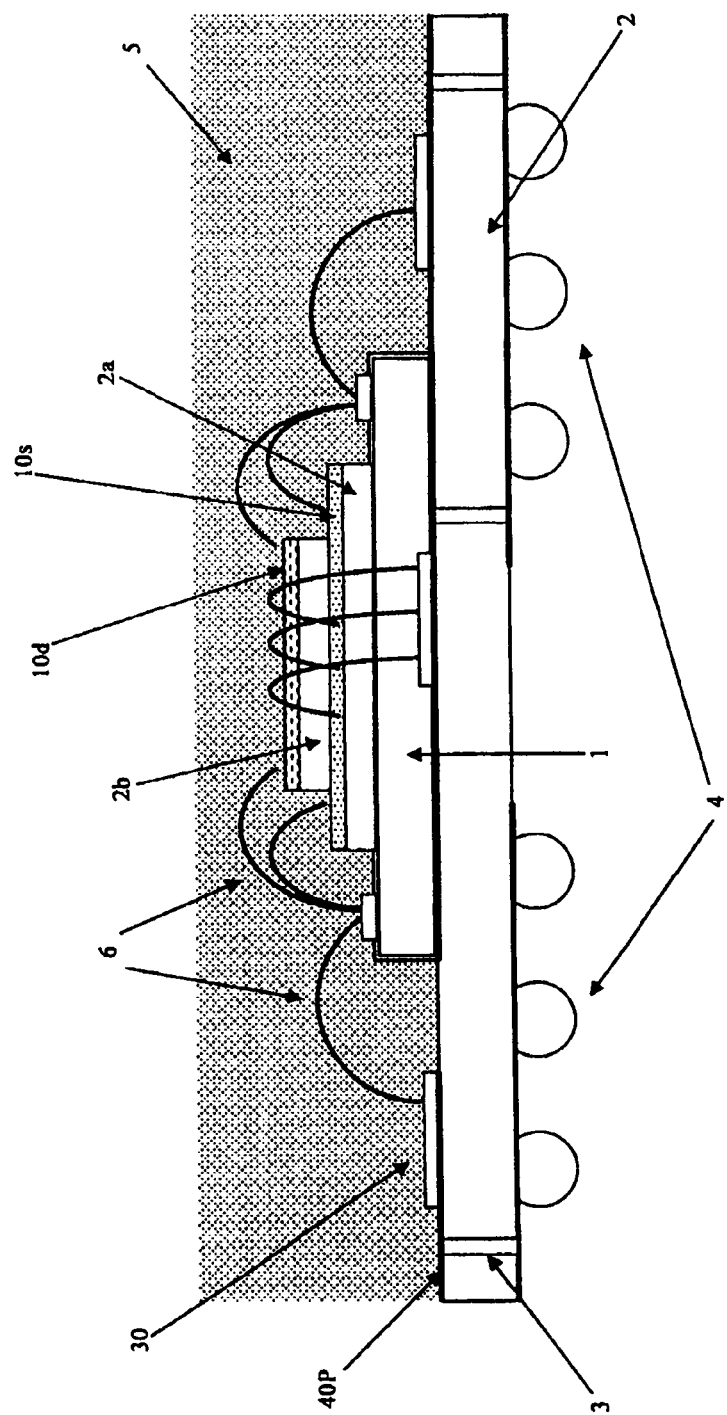
FIG. 7 is a longitudinal sectional view of the semiconductor device shown in FIG. 6.
Figure 8:
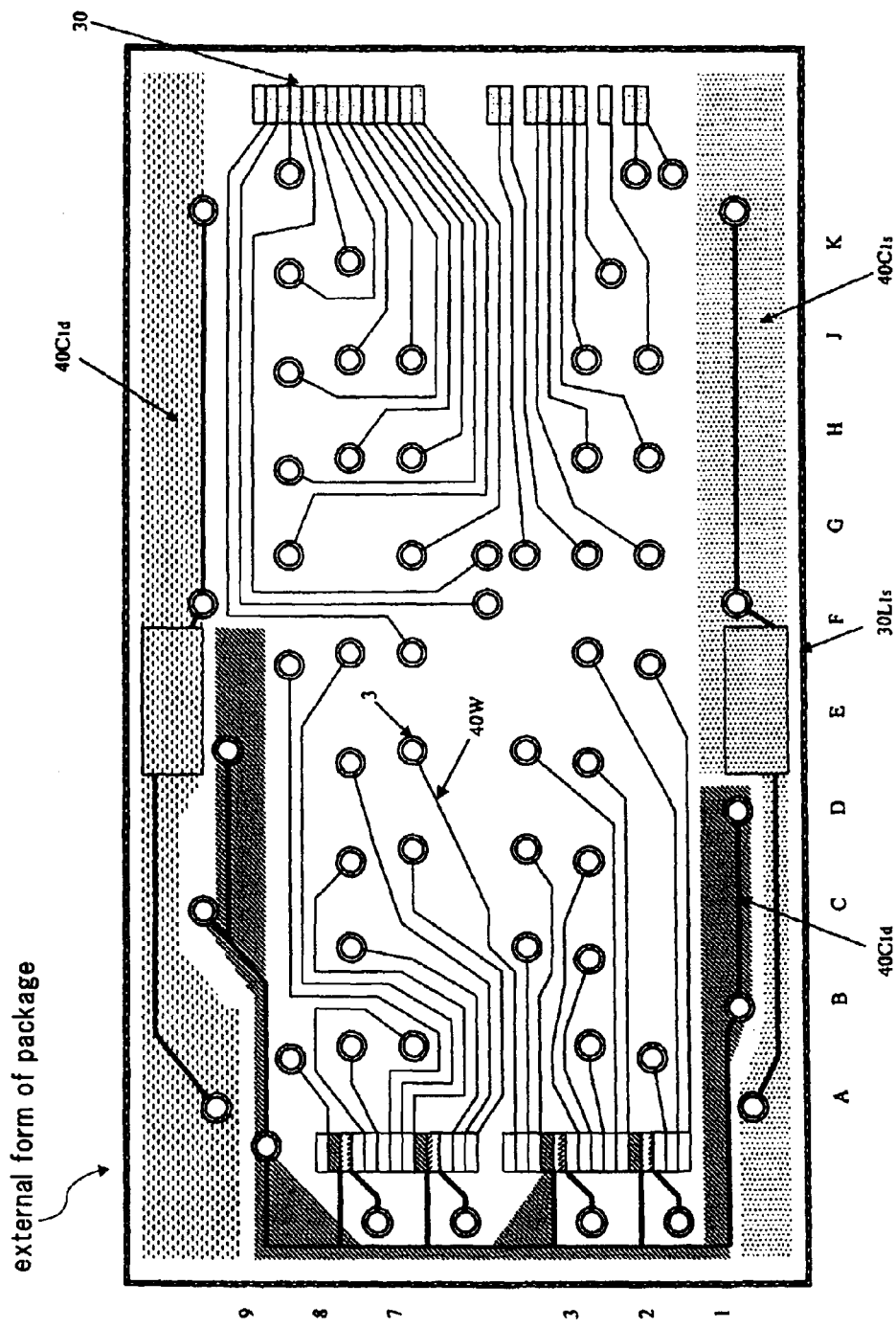
FIG. 8 is a substrate wiring diagram of the semiconductor device according to the exemplary embodiment (a side of the semiconductor chip)
Figure 9:
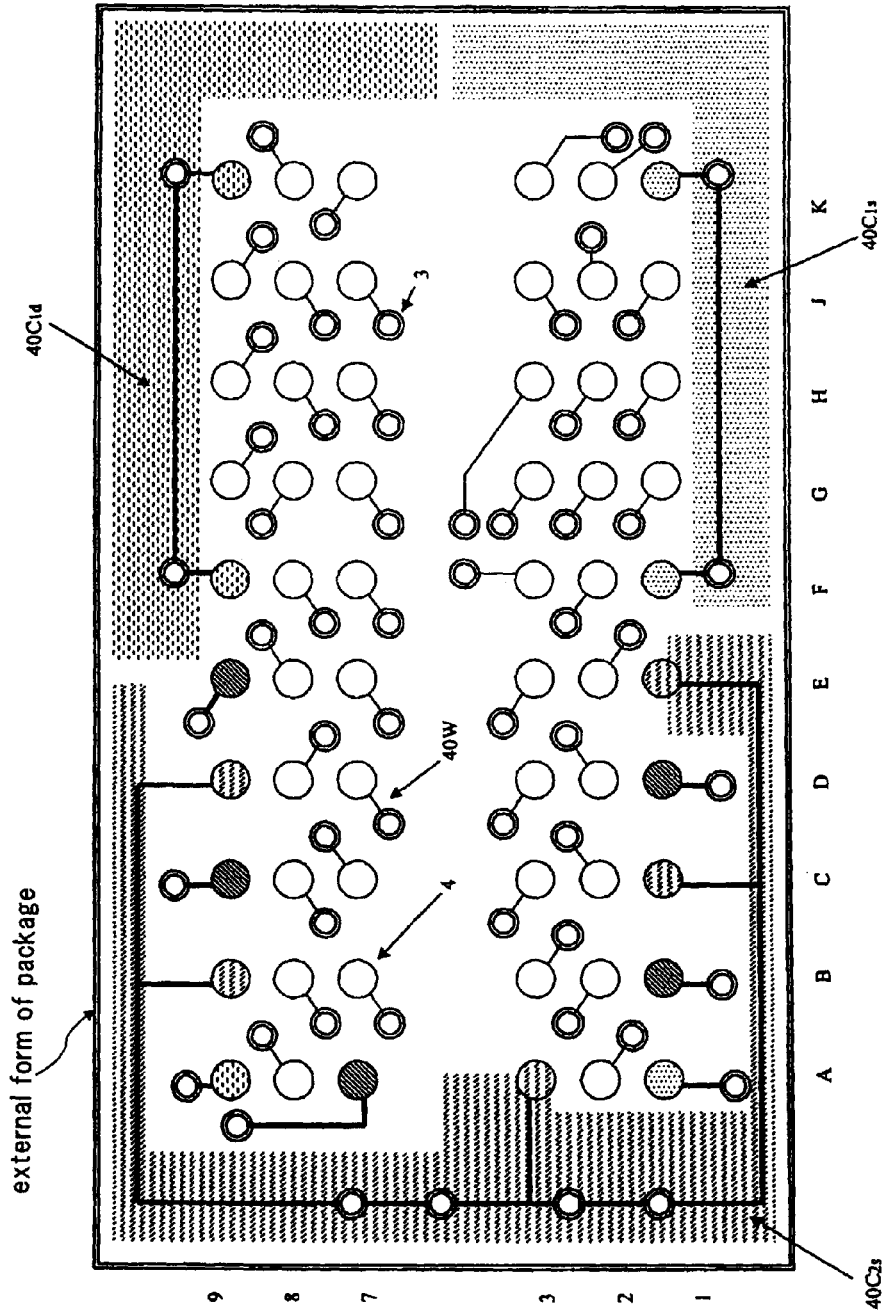
FIG. 9 is a substrate wiring diagram of the semiconductor device according to the exemplary embodiment (a side of external terminals)
Figure 10:
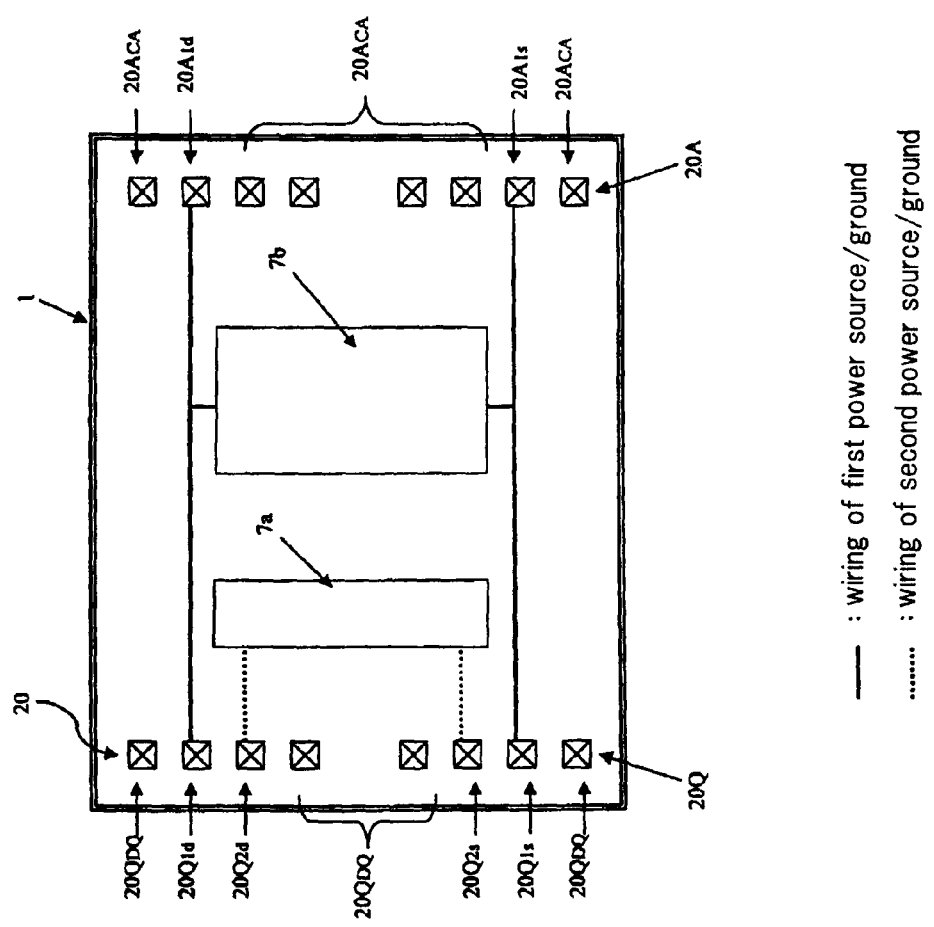
FIG. 10 is a block diagram showing a data output circuit and the circuit excluding the data output circuit of the semiconductor chip according to the exemplary embodiment.

FIG. 6 is a schematic diagram showing a semiconductor chip of a semiconductor device according to the exemplary embodiment. FIG. 7 is a longitudinal sectional view of the semiconductor device shown in FIG. 6. FIG. 8 is a substrate wiring diagram of the semiconductor device viewed from a side of the semiconductor chip. FIG. 9 is a substrate wiring diagram of the semiconductor device viewed from a side of external terminals. FIG. 10 shows a block diagram of a data output circuit and the circuit excluding the data output circuit of the semiconductor chip according to the exemplary embodiment.

Note that "DQ system," a term to be used in the following description, means a system used for data input and output, and "CA system" means a command/address system.

"First power source" and "VDD" indicate a power source (a first power supply potential) of the circuit excluding the data output circuit. "First ground" and "VSS" indicate a ground (a first ground potential) of the circuit excluding the data output circuit. "Second power source" and "VDDQ" indicate a power source (a second power supply potential) of the data output circuit. "Second ground" and "VSSQ" indicate a ground (a second ground potential) of the data output circuit.

Subscripts of respective symbols have following relationship. That is, as regards the subscripts, "CA" and "A" mean the CA system; "DQ" and "Q" mean the DQ system; "d" means a power source; "1d" means a first power source wiring; "2d" means a second power source wiring; "S" means a ground; "1s" means a first ground; "2S means a second ground; "L" means a land; and "C" means a wiring.

[Configuration of the Semiconductor Device]

Then semiconductor device of this embodiment includes semiconductor chip 1 resin encapsulated by encapsulating resin 5 on the upper surface (the side of semiconductor chip 1) of circuit board 2 as shown in FIG. 7. Semiconductor chip 1 of this embodiment has a rectangular shape in planar view, and includes side 1Q, side 1A opposite to side 1Q, side 1$d$ connecting sides 1Q and 1A, and side 1$s$ connecting sides 1Q and 1A and opposite to side 1$d$.

As shown in FIG. 10, semiconductor chip 1 has data output circuit 7$a$ and circuit 7$b$ excluding data output circuit 7$a$. Circuit 7$b$ excluding data output circuit 7$a$, for example, includes a memory core (memory cell array), an input circuit and other peripheral circuits (e.g., PLL, DLL, booster circuit, etc.).

On the upper surface (the side of semiconductor chip 1) of circuit board 2, there are formed connection lands 30 and signal wiring 40W as shown in FIG. 8. On the other hand, on the back surface (the side of external terminals 4) of circuit board 2, there are formed external terminals 4 and signal wiring 40W as shown in FIG. 9. Vias 3 are formed in circuit board 2 so as to penetrate circuit board 2. Signal wiring 40W on the upper surface of circuit board 2 electrically connects connection lands 30 and vias 3. Signal wiring 40W on the back surface of circuit board 2 electrically connects external terminals 4 and vias 3. Thus, connection lands 30 and external terminals 4 are electrically connected to each other.

Figure 21:
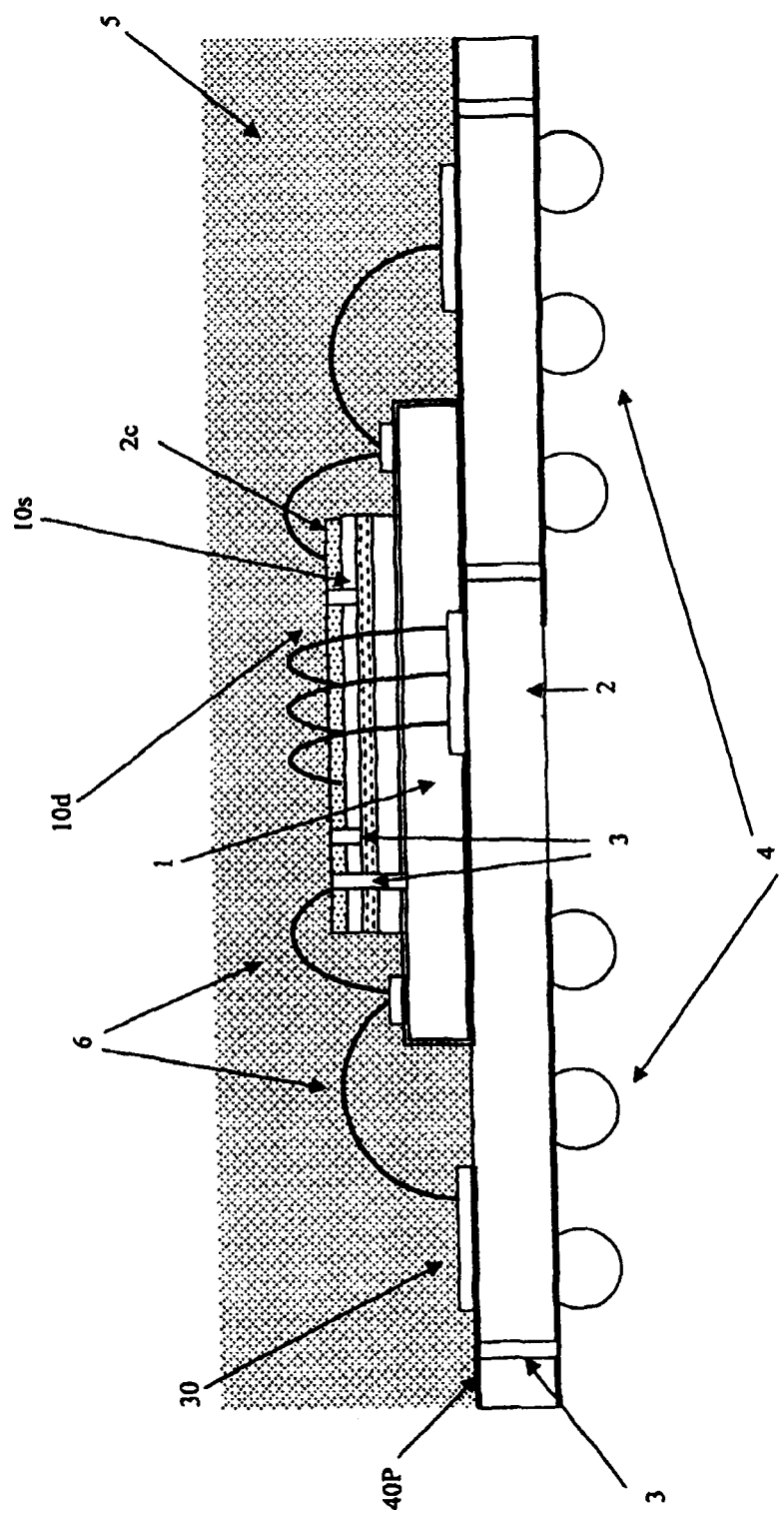
FIG. 21 is a longitudinal sectional view of the semiconductor device according to the exemplary embodiment that is manufactured by steps shown in FIGS. 16 to 20.

Additional substrate 2$a$ is provided on the upper surface of semiconductor chip 1. First additional wiring layer for ground 10$s$ is formed on the upper surface of additional substrate 2$a$. Additional substrate 2$b$ is further provided on additional substrate 2$a$. First additional wiring layer for power source 10$d$ is formed on the upper surface of additional substrate 2$b$. Thus, in a case of the semiconductor chip shown in FIGS. 6 and 7, both first additional wiring layer for power source 10$d$ and first additional wiring layer for ground 10$s$ are stacked on semiconductor chip 1, making up additional wiring layers on layers that are different from each other. Note that first additional wiring layer for power source 10$d$ and first additional wiring layer for ground 10$s$, which are solid patterns, form prescribed conductive areas on semiconductor chip 1. As shown in FIG. 21, the additional substrate formed on the upper surface of semiconductor chip 1 may be one additional substrate (multilayer board) 2$c$ where both first additional wiring layer for ground 10$s$ and first additional wiring layer for power source 10$d$ are formed.

Semiconductor chip 1 includes electrode pads 20, which are electrically connected to respective connection lands 30 by bonding wires 6. Electrode pads 20 are disposed in single lines on both sides and make up DQ system pad row 20Q and CA system pad row 20A, respectively. That is, DQ system pad row 20Q and CA system pad row 20A are disposed between the conductive area, including additional substrates 2$a$ and 2$b$, and edges of semiconductor chip 1.

On the other hand, on circuit board 2, there are provided connection lands 30 provided corresponding to respective electrode pads 20 of DQ system pad row 20Q and CA system pad row 20A, and connection lands 30$L_{1d}$ corresponding to first additional wiring layer for power source 10$d$ and connection land 30$L_{1s}$ corresponding to first additional wiring layer for ground 10$s$.

[Relationship of Electric Connection]

Next, a relationship of electric connection between data output circuit 7$a$, circuit 7$b$ excluding data output circuit 7$a$, each electrode pad 20, each connection land 30, each power source wiring and each ground wiring will be described with reference to FIG. 6. Note that DQ system pad row 20Q is for data input and output, and may also be referred to as a data input and output system pad row or a first pad row. CA system pad row 20A is for command/address, and may also be referred to as a command/address system pad row or a second pad row.

Data Output Circuit

Data output circuit 7$a$ is connected to second power source pad 20$Q_{2d}$, DQ system signal pad 20$Q_{DQ}$ and second ground pad 20$Q_{2s}$. As will be described later, data output circuit 7$a$ is supplied with a second power source potential and a second ground potential from second power source wiring 40$C_{2d}$ and second ground wiring 40$C_{2S}$.

Circuit Excluding Data Output Circuit

Circuit 7$b$ is connected to first power source pad 20$Q_{1d}$, first ground pad 20$Q_{1s}$ and CA system signal pad 20$A_{CA}$. As will be described later, circuit 7$b$ is supplied with a first power source potential from first power source wiring 40$C_{1d}$ through first additional wiring layer for power source 10$d$, and with a first ground potential from first ground wiring $40C_{1s}$ through first additional wiring layer for ground $10_s$.

DQ System Pad Row—Connection Pad—DQ System Signal Wiring, Second Power Source/Ground Wiring First, the connection relationship between DQ system pad row 20Q, connection land 30, and the DQ system signal wiring or the second power source/ground wiring will be described.

DQ system pad row 20Q is formed at side 10 of semiconductor chip 1. DQ system pad row 20Q includes first power source pad $20Q_{1d}$, second power source (VDDQ) pad $20Q_{2d}$, DQ system signal pad $20Q_{DQ}$, second ground (VSSQ) pad $20Q_{2s}$, and first ground pad $20Q_{1s}$. Among these pads, those to be connected to connection lands 30 are connected to connection lands 30 disposed on side 10. Each electrode pad 20 will hereinafter be described in turn starting from upper disposed one in FIG. 6.

First power source pad $20Q_{1d}$ is connected to first additional wiring layer for power source $10d$ by bonding wire 6.

Second power source pad $20Q_{2d}$ is connected to second connection land for power source $30L_{2d}$ by bonding wire 6. Second connection land for power source $30L_{2d}$ is connected to second power source wiring $40C_{2d}$.

DQ system signal pad $20Q_{DQ}$ is connected to connection land for DQ system signal $30L_{DQ}$ by bonding wire 6. Connection land for DQ system signal $30L_{DQ}$ is connected to DQ system signal wiring $40C_{DQ}$.

Second ground pad $20Q_2$, is connected to second connection land for ground $30L_2$, by bonding wire 6. Second connection land for ground $30L_2$, is connected to second ground wiring $40C_{2s}$.

First ground pad $20Q_{1s}$ is connected to first additional wiring layer for ground $10s$ by bonding wire 6.

Note that the direction in which second power source wiring $40C_{2d}$ is extended from second connection land for power source $30L_{2d}$ and the direction in which second ground wiring $40C_2$, is rextended from second connection land for ground $30L_2$, are identical to the direction in which DQ system signal wiring $40C_{DQ}$ is extended from connection land for DQ system signal $30L_{DQ}$. Thus, second power source wiring $40C_{2d}$ and second ground wiring $40C_2$, form a feedback current path to DQ system signal wiring $40C_{DQ}$, thereby reducing switching noise owing to switching of the output circuit.

Both second power source wiring $40C_{2d}$ and second ground wiring $40C_2$, are preferably disposed adjacent to DQ system signal wiring $40C_{DQ}$. Such adjacent disposition can increase mutual inductances of second power source wiring $40C_{2d}$ and second ground wiring $40C_{2s}$ with respect to DQ system signal wiring $40C_{DQ}$. As a result, the effective inductance value of DQ system signal wiring $40C_{DQ}$ is further reduced, thereby allowing low noise and enabling signal transmission to be performed at higher speed.

CA System Pad Row—Connection Pad—Each Wiring

Next, a connection relationship between CA system pad row 20A, connection land 30 and each wiring will be described.

CA system pad row 20A is formed at side 1A. CA system pad row 20A includes first power source pad $20Q_{1d}$, CA system signal pad $20A_{CA}$ and first ground pad $20Q_{1s}$. Among these pads, those to be connected to connection land 30 are connected to connection lands 30 disposed at side 1A. Each electrode pad 20 will be described in turn starting from upper disposed one in FIG. 6.

First power source pad $20Q_{1d}$ is connected to first additional wiring layer for power source $10d$ by bonding wire 6.

CA system signal pad $20A_{CA}$ is connected to connection land for CA system signal $30L_{CA}$ by bonding wire 6. Connection land for CA system signal $30L_{CA}$ is connected to CA system signal wiring $40C_{CA}$.

First ground pad $20Q_1$, is connected to first additional wiring layer for ground $10s$ by bonding wire 6.

First Power Source Wiring—Connection Land—Additional Wiring Layer

Next, a disposition relationship between first power source wiring $40C_{1d}$, first connection land for power source $30L_{1d}$ and first additional wiring layer for power source $10d$ will be described.

First connection land for power source $30L_{1d}$ is formed at side $1d$ of semiconductor chip 1. First power source wiring $40C_{1d}$ is connected to first connection land for power source $30L_{1d}$. First connection land for power source $30L_{1d}$ and first power source wiring $40C_{1d}$ are solid patterns. First connection lands for power source $30L_{1d}$ are connected to first additional wiring layer for power source $10d$ by bonding wires 6.

First Ground Wiring—Connection Land—Additional Wiring Layer

Next, a disposition relationship between first ground wiring $40C_{1s}$, first connection land for ground $30L_{1s}$ and first additional wiring layer for ground $10s$ will be described.

First connection land for ground $30L_{1s}$ is formed at side $1s$ of semiconductor chip 1. First ground wiring $40C_1$, is connected to first connection land for ground $30L_{1s}$. First connection land for ground $30L_{1s}$ and first ground wiring $40C_1$, are solid patterns. First connection lands for ground $30L_{1s}$ are connected to first additional wiring layer for ground $10s$ by bonding wires 6.

Thus, in this exemplary embodiment, first power source wiring $40C_{1d}$ and ground wiring $40C_1$, are not directly connected to electrode pad 20, but are connected through additional wiring layers $10d$ and $10s$ instead.

[Operation of Semiconductor Device]

Next, an operation of the semiconductor device with the aforementioned configuration will be described with reference to FIGS. 11 to 15.

Figure 1:
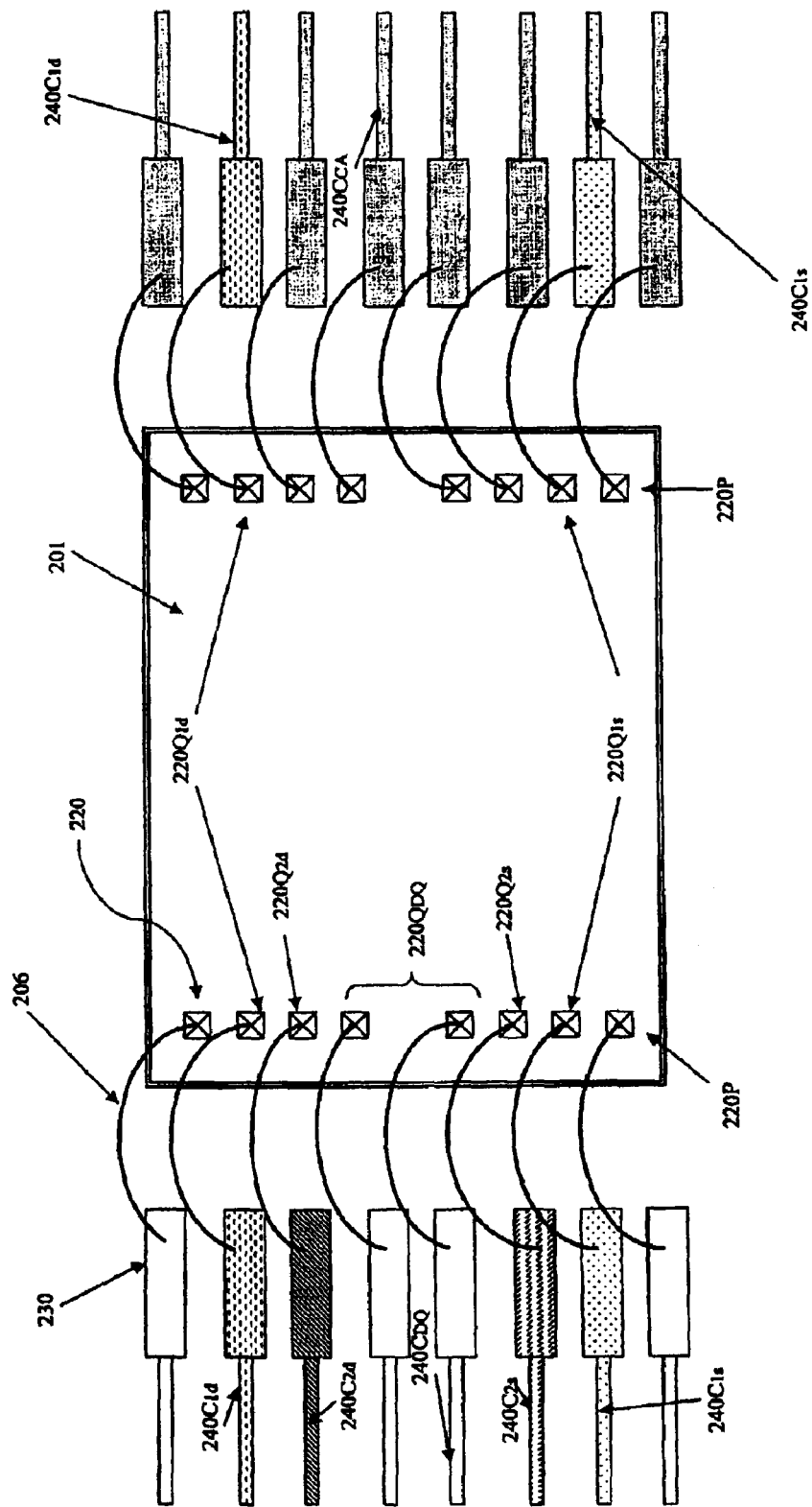
FIG. 1 is a schematic diagram showing a semiconductor chip of a semiconductor device related to the present invention.
Figure 2:
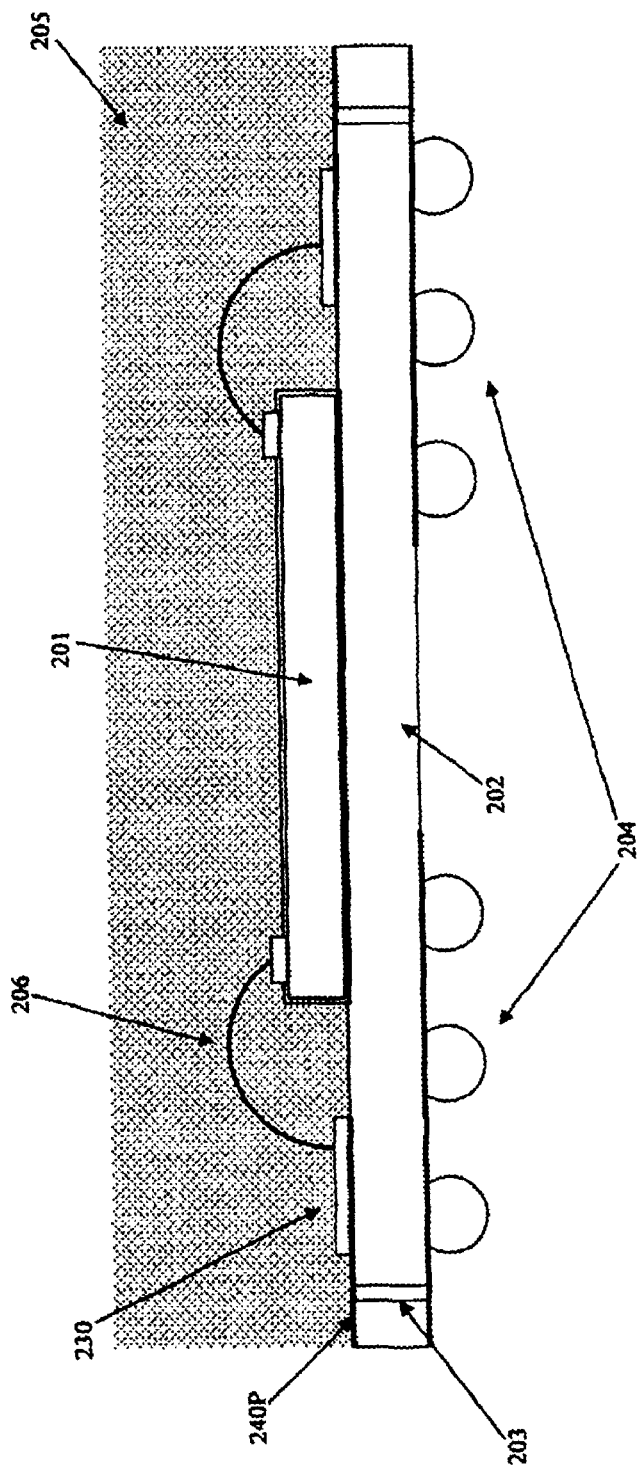
FIG. 2 is a longitudinal sectional view of the semiconductor device shown in FIG. 1.
Figure 3:
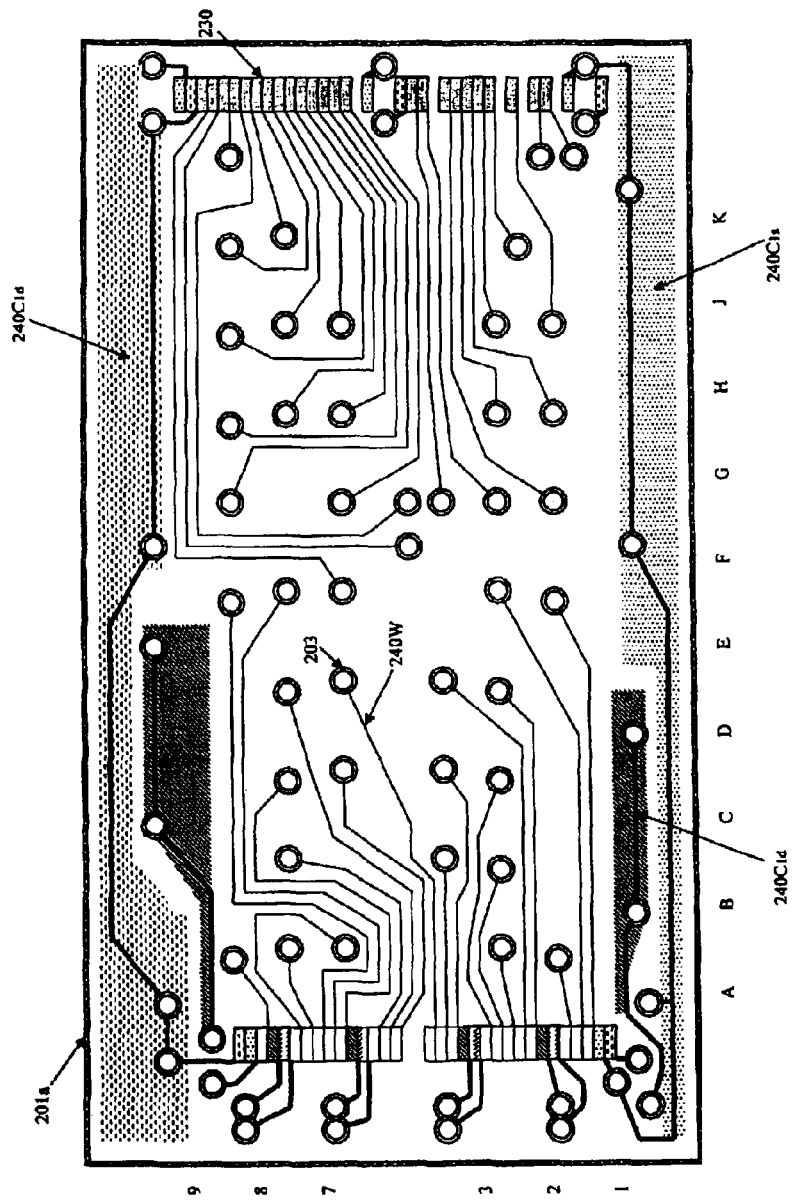
FIG. 3 is a substrate wiring diagram of the semiconductor device related to the present invention (a side of the semiconductor chip)
Figure 4:
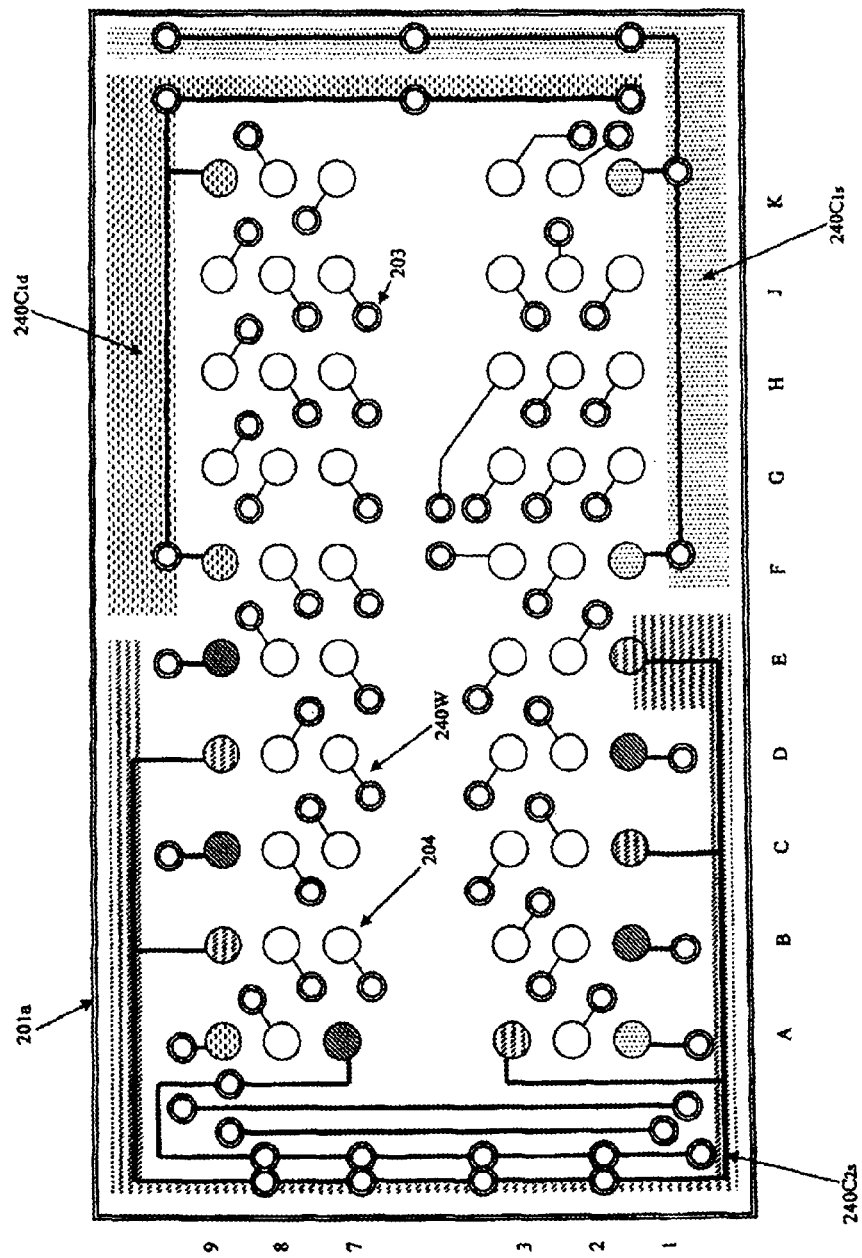
FIG. 4 is a substrate wiring diagram of the semiconductor device related to the present invention (a side of external terminals)
Figure 5:
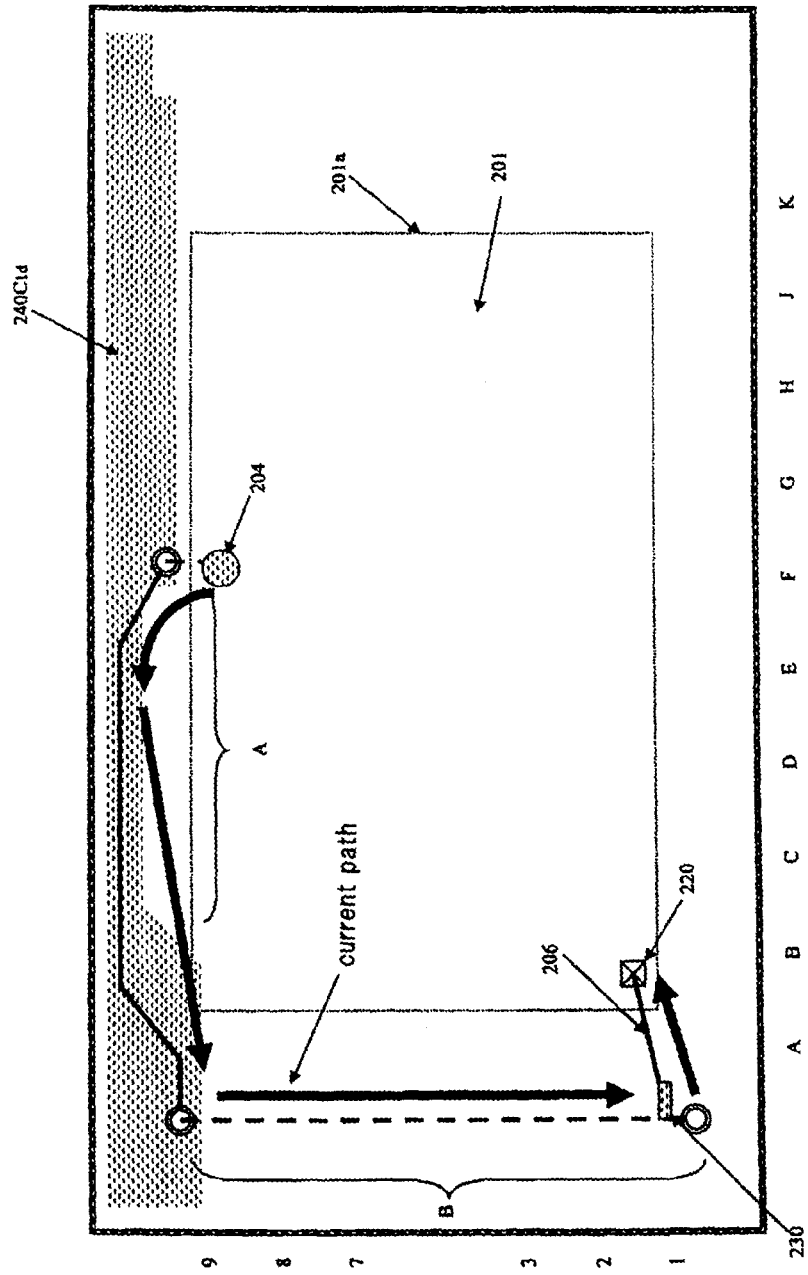
FIG. 5 is a diagram illustrating a wiring from a specific external terminal to an electrode pad in the substrate wiring shown in FIG. 3.
Figure 11:
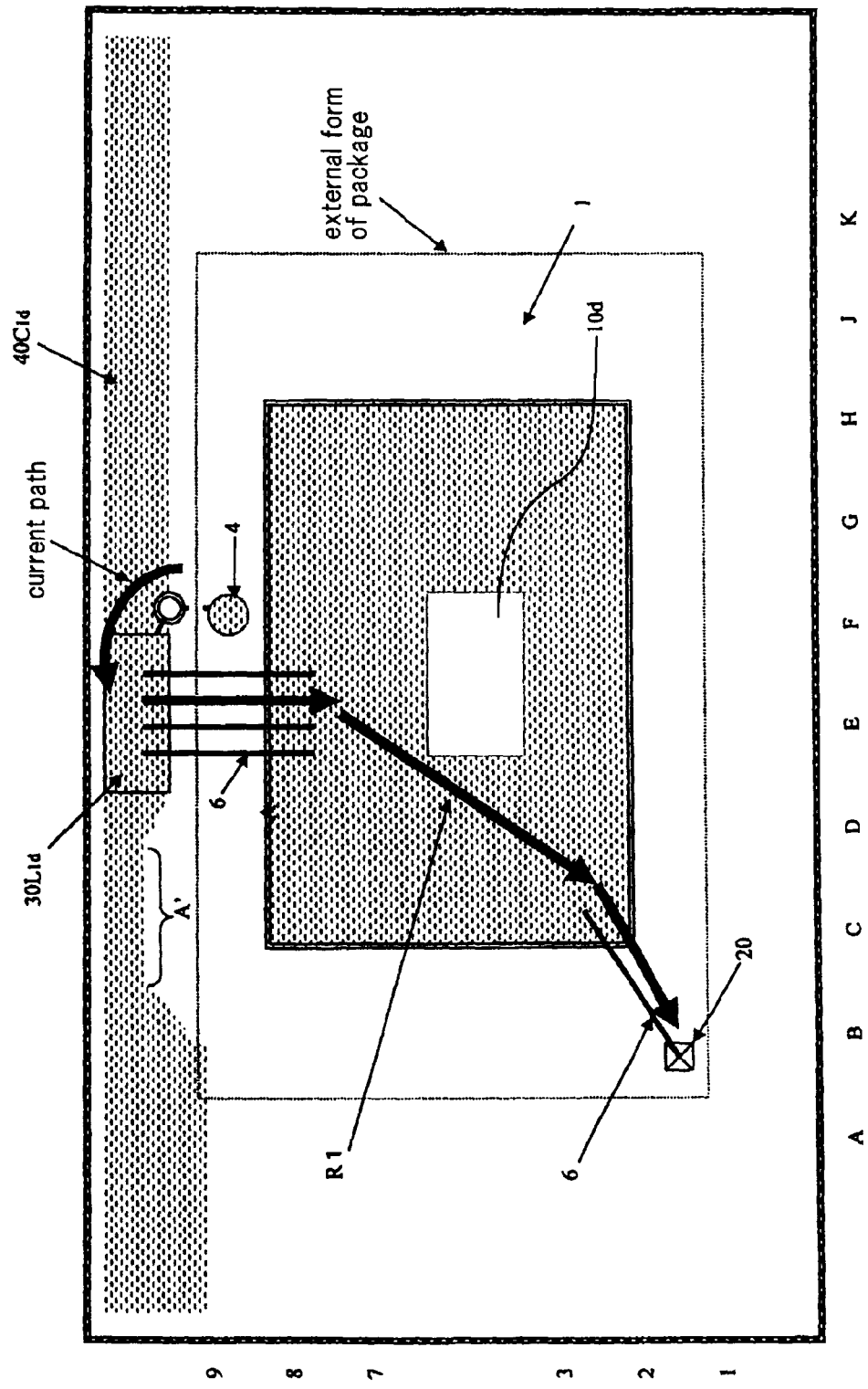
FIG. 11 is a diagram illustrating a first power source wiring from a specific external terminal to an electrode pad in the substrate wiring diagram shown in FIG. 8.
Figure 12:
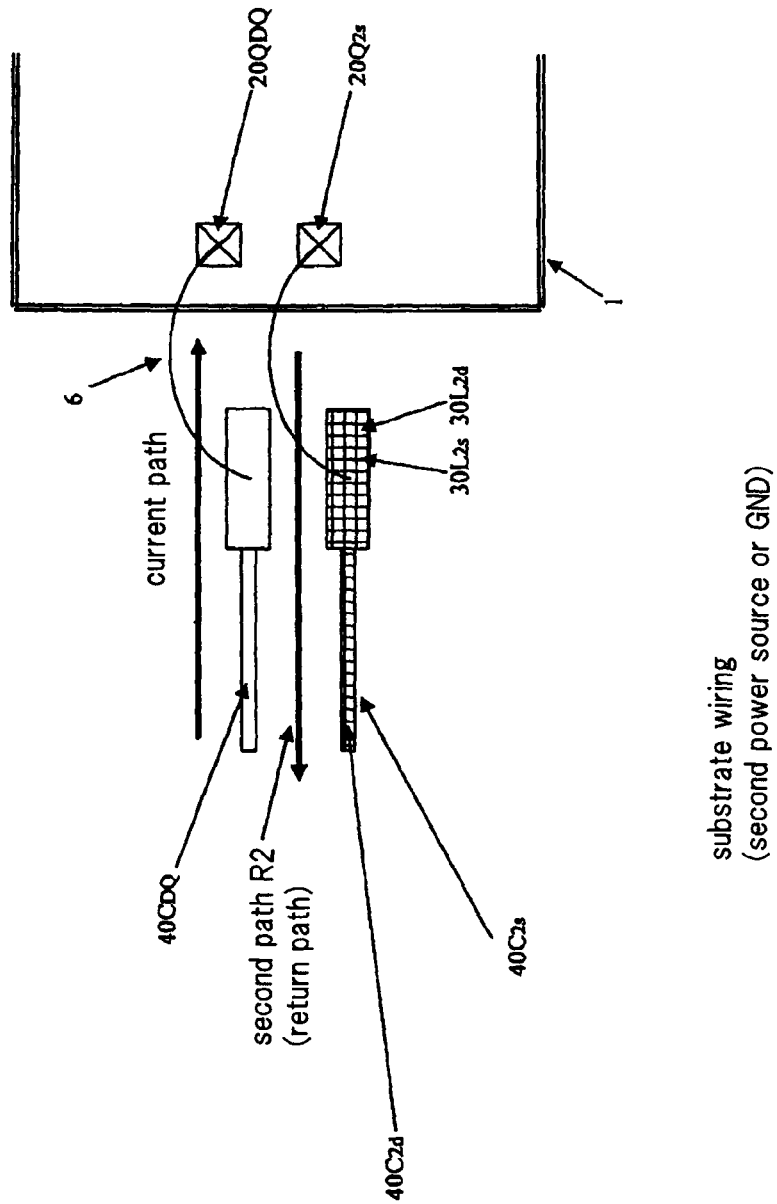
FIG. 12 is a wiring diagram for a DQ system signal and a second power source and ground in the substrate wiring diagram of the exemplary embodiment.
Figure 13:
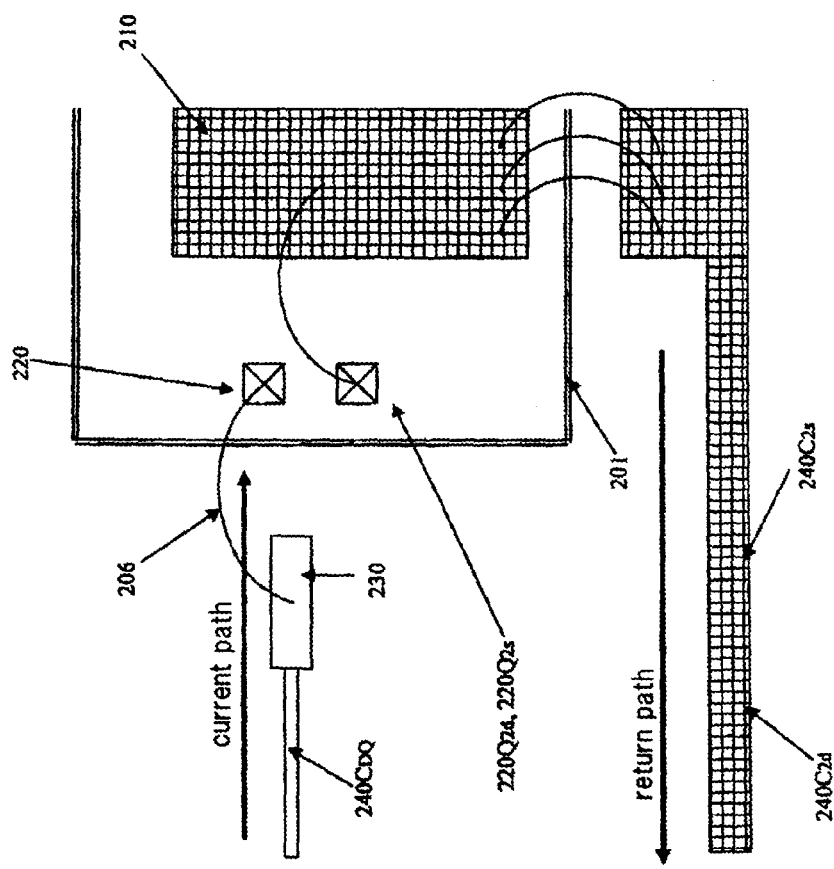
FIG. 13 is a wiring diagram for a DQ system signal and a second power source and ground in the substrate wiring diagram related to the present invention.
Figure 14:
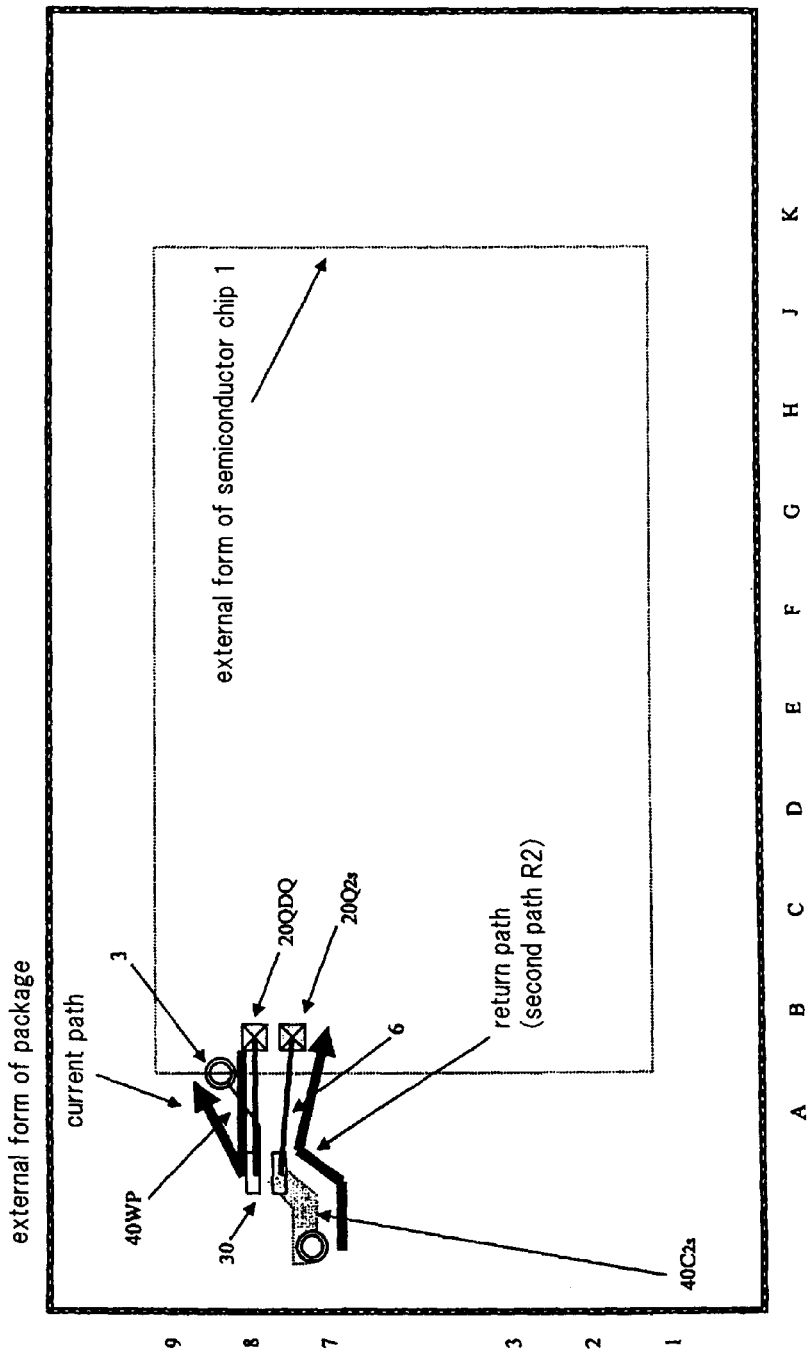
FIG. 14 is a diagram showing a relationship between a prescribed DQ system signal wiring and a prescribed second ground in the substrate wiring diagram (the side of the semiconductor chip) shown in FIG. 8.
Figure 15:
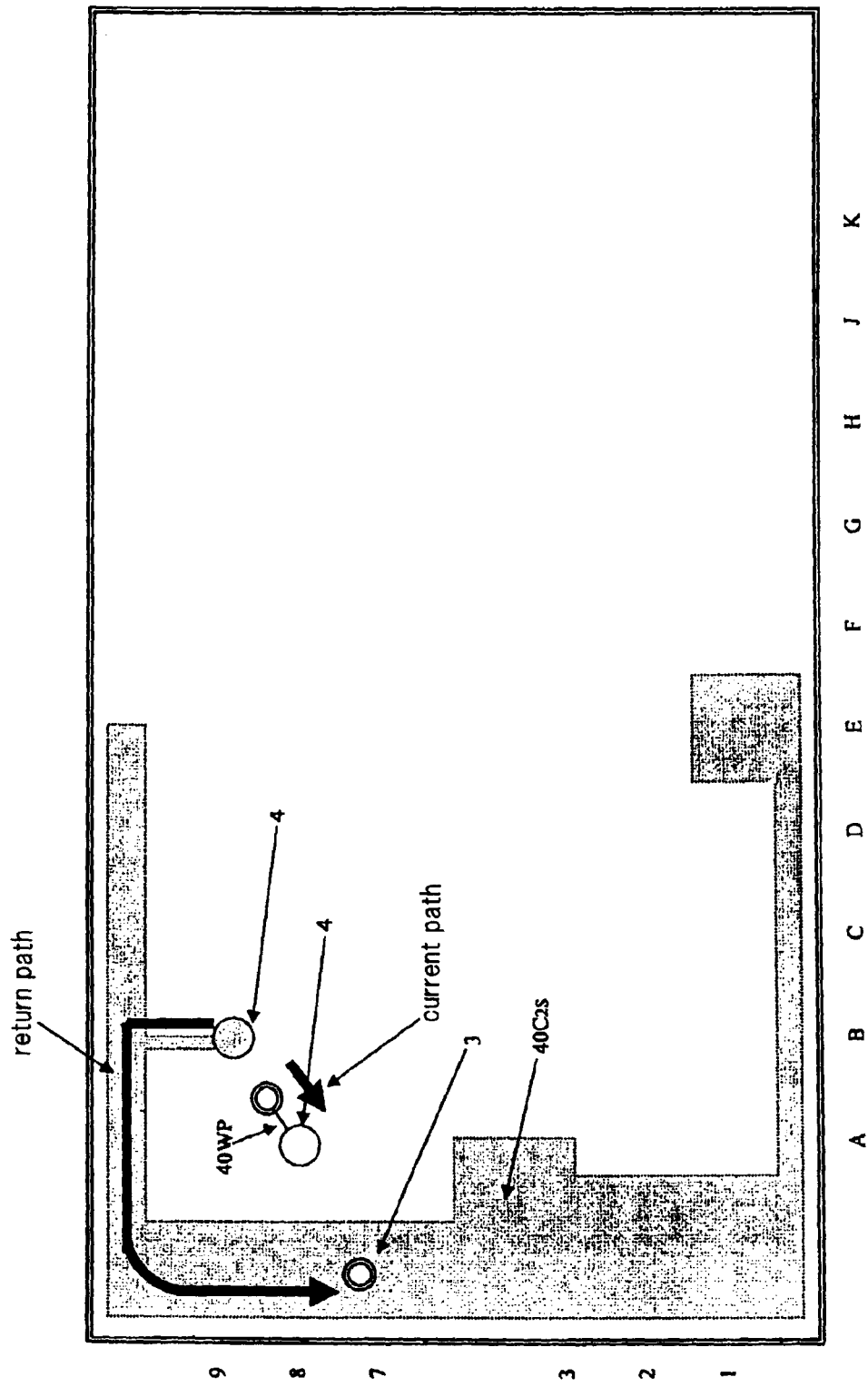
FIG. 15 is a diagram showing a relationship between the prescribed DQ system signal wiring and the prescribed second ground in the substrate wiring diagram (the side of the external terminals) shown in FIG. 9.

FIG. 5 is, as described above, a diagram illustrating the wiring from a specific external terminal to an electrode pad in substrate wiring diagram shown in FIG. 3. FIG. 11 is a diagram illustrating a wiring from a specific external terminal to an electrode pad in the substrate wiring diagram shown in FIG. 8. FIG. 12 is a wiring diagram about a DQ system signal and a second power source/ground in the substrate wiring diagram of the exemplary embodiment. FIG. 13 is a wiring diagram about a DQ system signal and a second power source/ground in a substrate wiring diagram of an art related to the present invention for the sake of comparison. FIG. 14 is a diagram showing a relationship between the prescribed DQ system signal wiring and the prescribed second ground in the substrate wiring diagram (the side of semiconductor chip 1) shown in FIG. 8. FIG. 15 is a diagram showing a relationship between the prescribed DQ system signal wiring and the prescribed second ground in the substrate wiring diagram (the side of external terminal 4) shown in FIG. 9.

First, FIGS. 5 and 11 will be compared with each other and current path P from the specific external terminal to the electrode pad in the substrate wiring diagram will be described.

Current path P of the art related to the present invention shown in FIG. 5 is provided according to the following order:

[1] External terminal 204;

[2] Substrate wiring pattern (first power source wiring $240C_{1d}$ including a part with a reduced trace width (part A in the diagram) and a long and narrow pattern indicated with a broken line (part B in the diagram));

[3] Connection land 230;
[4] Bonding wire 206; and
[5] Electrode pad 220.

On the other hand, current path P' of this exemplary embodiment shown in FIG. 11 is provided according to the following order:

[1'] External terminal 4;
[2'] Substrate wiring pattern (first power source wiring $40C_{1d}$ with a size close to that of a solid pattern, excluding a part of a decreased trace width (part A' in the diagram));
[3'] Connection land $30L_{1d}$;
[4'] Bonding wires 6;
[5'] First additional wiring layer for power source 10*d* (solid pattern);
[6'] Bonding wire 6; and
[7'] Electrode pad 20.

According to the configuration shown in FIG. 5, there exist the part with a reduced trace width (part A in the diagram) and the long and narrow pattern indicated with the broken line (part B in the diagram) in the aforementioned current path P in [2] substrate wiring pattern. On the other hand, a trace for current path P' excludes the part of the decreased trace width (part A' in the diagram) and the long and narrow trace part, and has a size that is close to that of a solid pattern in [2'] substrate wiring pattern shown in FIG. 11. The wiring impedance on the substrate in the configuration shown in FIG. 11 therefore becomes smaller than that shown in the art related to the present invention shown in FIG. 5.

According to the configuration shown in FIG. 11, since [5'] first additional wiring layer for power source 10*d* is also a solid pattern, the impedance thereof is smaller than that of the substrate wiring pattern that is not a solid pattern. Furthermore, according to the configuration shown in FIG. 11, [3'] connection land $30L_{1d}$ and [5'] first additional wiring layer for power source 10*d* are connected by [4'] bonding wires 6. The plurally prepared bonding wires have an impedance smaller than that of a single bonding wire.

According to the configuration shown in FIG. 5, external terminal 204 and electrode pad 220 are connected by the wiring that detours around semiconductor chip 201. On the other hand, since first additional wiring layer for power source 10*d* which is a prescribed conductive area on semiconductor chip 1 is routed, the circuit excluding the data output circuit is supplied with the first power source potential and the first ground potential over first path R1, which is a straight current path, according to the configuration of FIG. 11. Thus, the conductor length from external terminal 4 to electrode pad 20 according to the present invention is shorter than that of the art related to the present invention. Therefore, the present invention allows the external terminal and electrode pad to be connected with an impedance smaller than that of the art related to the present invention.

Next, the disposition relationship between the DQ system signal wiring, the second power source wiring and the second ground wiring will be described using FIGS. 12 and 13. Note that second power source wiring $40C_{2d}$ and second ground wiring $40C_2$, are collectively illustrated in FIG. 12 for the simplicity sake. Likewise, second power source wiring $240C_{2d}$ and second ground wiring $240C_2$, are collectively illustrated in FIG. 13.

In the configuration of this exemplary embodiment shown in FIG. 12, the data output circuit is supplied with the second power source potential or the second ground potential from circuit board 2 over second path R2 that forms a feedback current path of a data signal to be outputted to circuit board 2 from the data output circuit. Thus, according to this exemplary embodiment, second path R2 including second power source wiring $40C_{2d}$ and second ground wiring $40C_2$, are wired so as to be shortened to adjoin the DQ system signal wiring $40C_{DQ}$ in the same direction, thereby allowing the effective inductance to be reduced.

On the other hand, in Japanese Patent Laid-Open No. 2004-327757, any power source wiring and ground wiring are routed on an additional wiring layer. If this were applied to the present invention, second power source wiring $240C_{2d}$ and second ground wiring $240C_2$, would be routed using first additional wiring layer for power source 10*d* and first additional wiring layer for ground 10*s* in the same manner as with first power source wiring $40C_{1d}$ and first ground wiring $40C_1$, of the exemplary embodiment, as shown in FIG. 13. Thus, in the configuration shown in FIG. 13, second power source wiring $240C_{2d}$ and second ground wiring $240C_2$, are arranged apart from DQ system signal wiring $240C_{DQ}$, and not adjacent to each other.

Here, effective inductance values are calculated by simulating the configuration of this exemplary embodiment shown in FIG. 12 and on the configuration shown in FIG. 13. A result in which the configuration shown in FIG. 12 can reduce the effective inductance value to about a quarter with respect to the configuration shown in FIG. 13 has been obtained. Thus, the configuration shown in FIG. 12 wires second path R2, i.e. return path, adjacent to DQ system signal wiring $40C_{DQ}$, thereby allowing prevention of a drop in voltage and an increase in noise. This enables signal transmission to be performed at higher speed.

Both second power source wiring $40C_{2d}$ and second ground wiring $40C_2$, are preferably disposed adjacent to DQ system signal wiring $40C_{DQ}$. Such adjacent disposition allows mutual inductances of second power source wiring $40C_{2d}$ and second ground wiring $40C_{2s}$ with respect to DQ system signal wiring $40C_{DQ}$ to be increased. As a result, the effective inductance value of DQ system signal wiring $40C_{DQ}$ is further reduced, thereby allowing low noise. Therefore this enables signal transmission to be performed at higher speed.

Next, a relationship between the prescribed DQ system signal wiring and the prescribed second ground wiring will be described using FIGS. 14 and 15.

The present invention adopts a configuration in which the second power source/ground system (VDDQ and VSSQ) are extended from the semiconductor chip so that the second power source/ground system can run parallel to the output data signal. This can realize a configuration of the circuit board where the wiring of the second power source/ground system (VDDQ and VSSQ) runs through the position that is closer to the wiring of the output data signal, in comparison with a case where the second power source/ground system is routed using the additional wiring layer (the configuration as shown in FIG. 13). As a result, the effective inductance value of the DQ system signal wiring is further reduced, thereby enabling signal transmission to be performed at higher speed.

[Process for Manufacturing Semiconductor Device]

Next, a process for manufacturing the semiconductor device according to the present invention will be described with reference to FIGS. 16 to 20.

Figure 16:
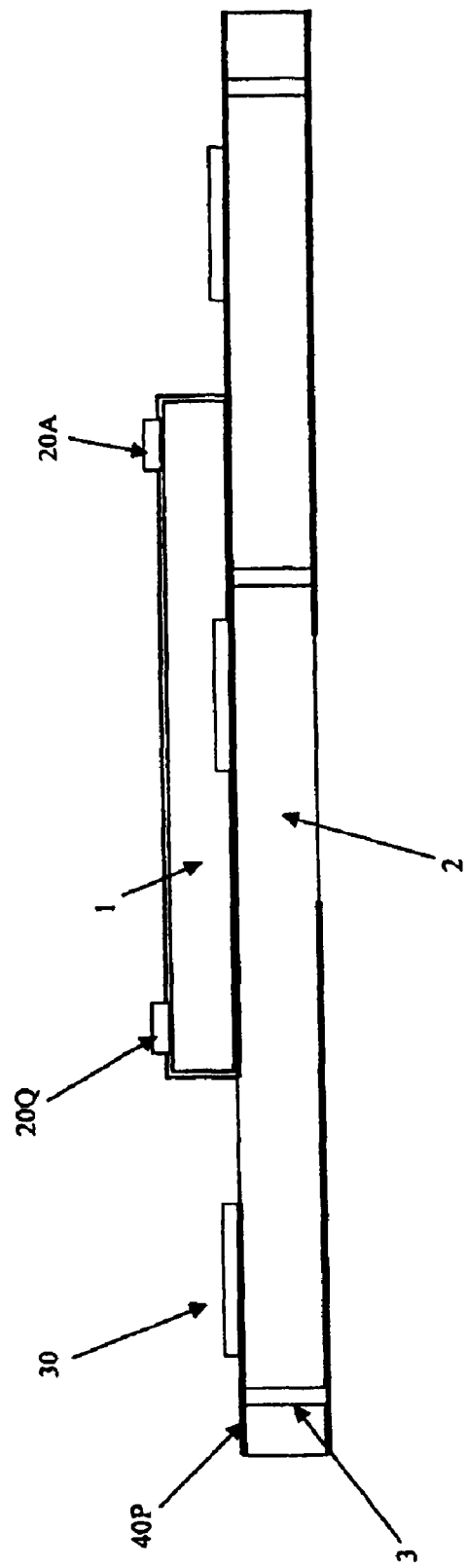
FIG. 16 is a diagram illustrating a method for manufacturing the semiconductor device according to the exemplary embodiment.

As shown in FIG. 16, semiconductor chip 1 where CA system pad row 20A and DQ system pad row 20Q are formed is mounted face up (circuit side facing up) on circuit board 2.

Figure 17:
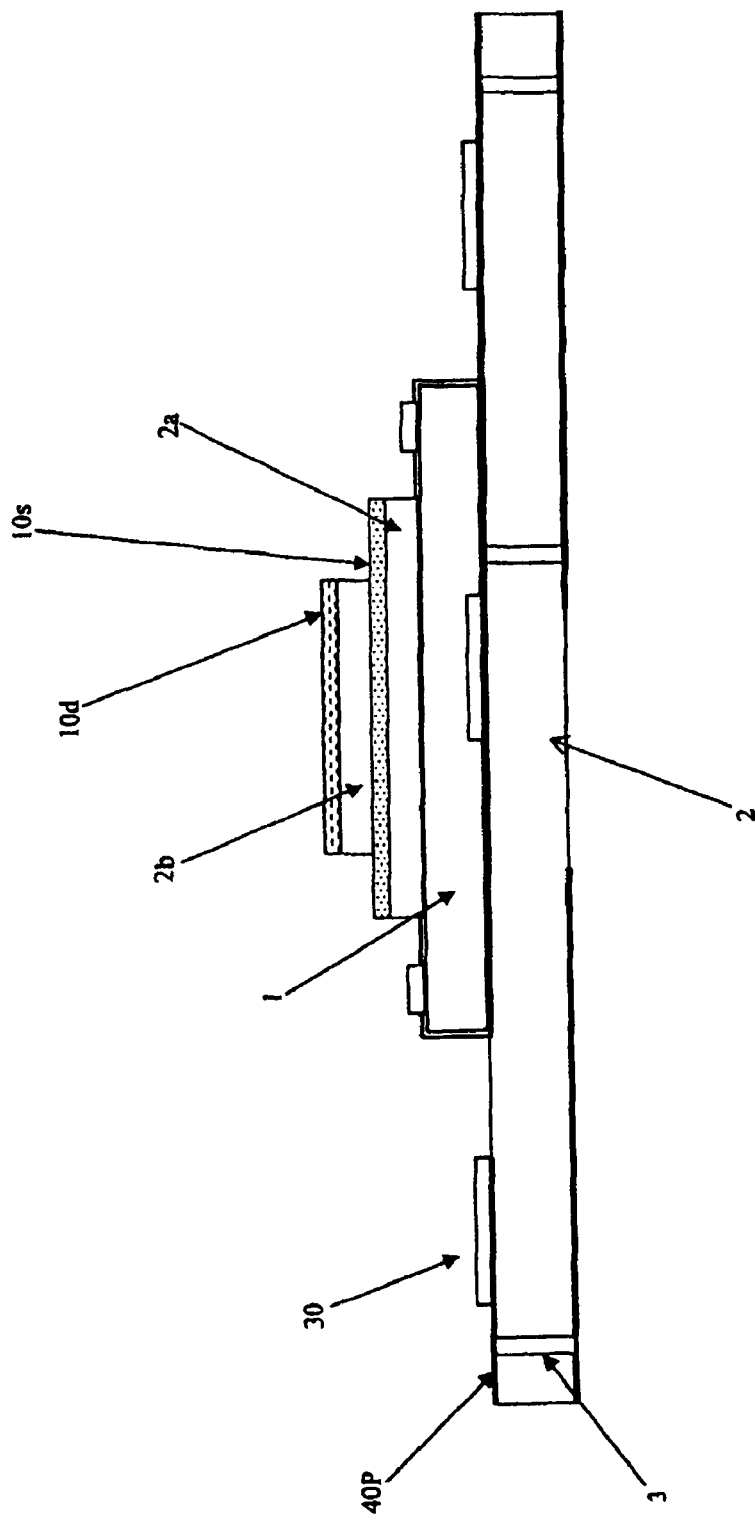
FIG. 17 is a diagram showing a status where an additional substrate including an additional wiring layer is stacked on the semiconductor chip shown in FIG. 16.

Next, as shown in FIG. 17, first additional wiring layer for power source 10*d* and first additional wiring layer for ground 10*s* are formed on semiconductor chip 1. Note that, in this exemplary embodiment, additional substrate 2*a* is provided on semiconductor chip 1, and additional substrate 2*b* is further provided on additional substrate 2*a* in a stacked manner. First additional wiring layer for ground 10*s* is formed on the upper surface of additional substrate 2a, and first additional wiring layer for power source 10d is formed on additional substrate 2b.

Figure 18:
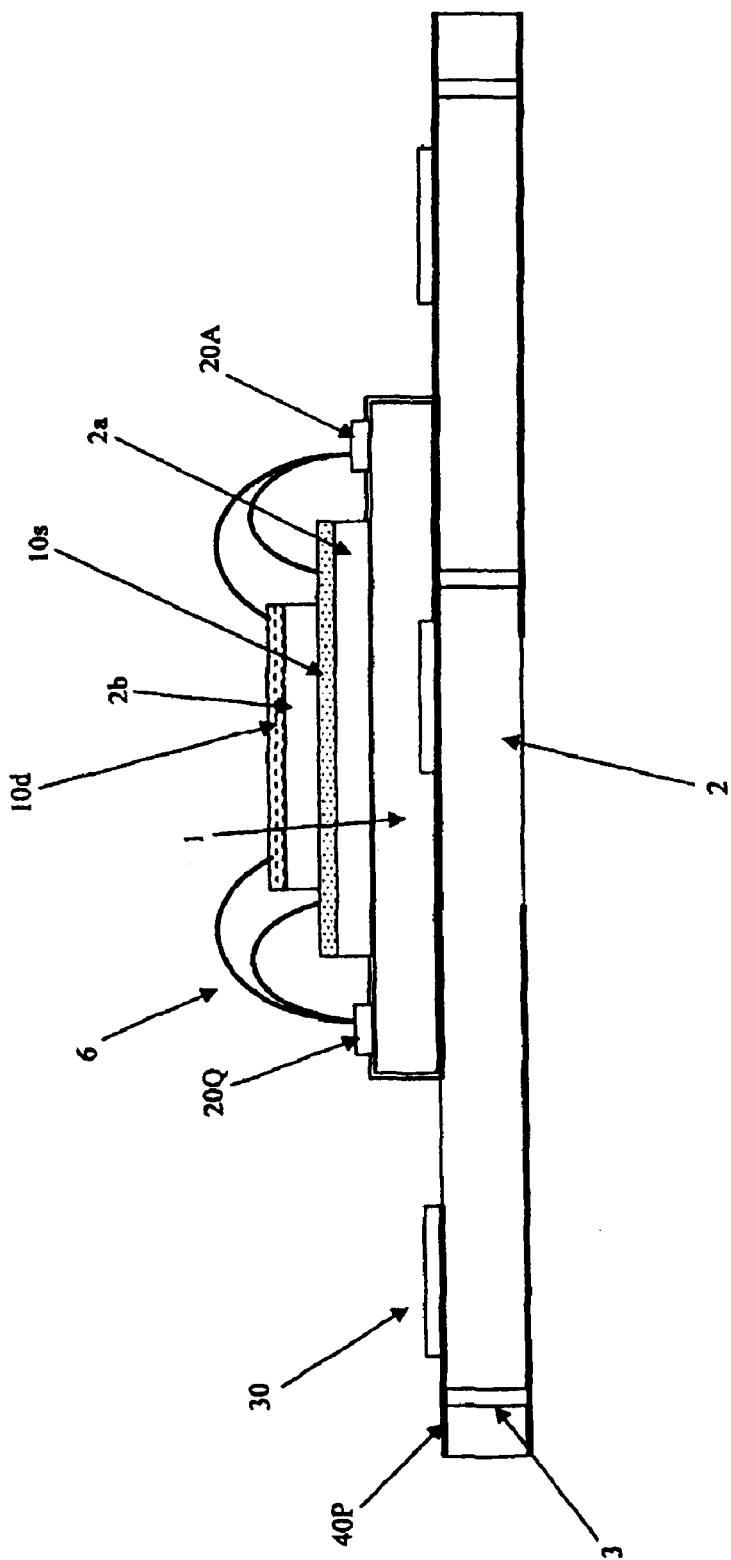
FIG. 18 is a diagram showing a status where the electrode pad and the additional wiring layer are connected to each other by a bonding wire on the semiconductor chip shown in FIG. 17.

Next, as shown in FIG. 18, first power source pad $20Q_{1d}$ and first additional wiring layer for power source 10d are connected to each other by bonding wire 6. First ground pad $20Q_1$, and first additional wiring layer for ground 10s are also connected to each other by bonding wire 6.

Figure 19:
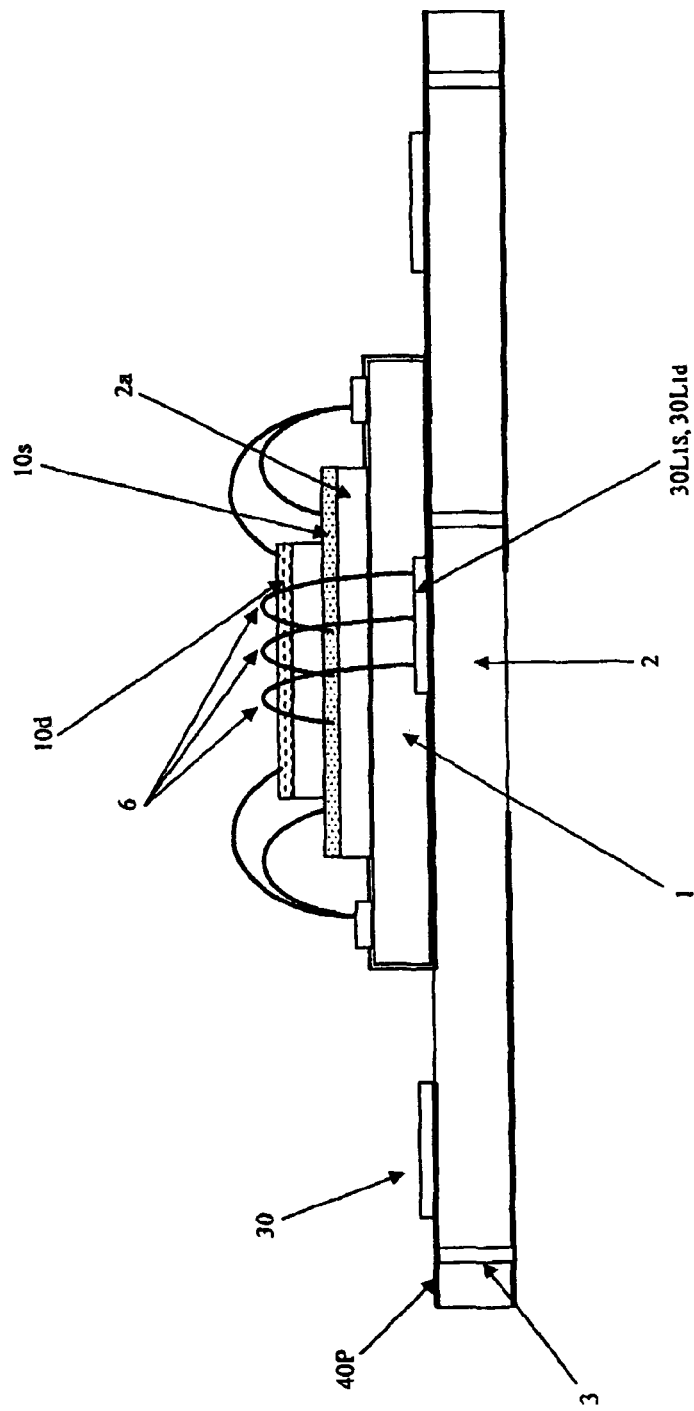
FIG. 19 is a diagram showing a status where the additional wiring layer and connection lands on the circuit board are connected to each other by bonding wires on the semiconductor chip shown in FIG. 18.

Next, as shown in FIG. 19, arbitrary positions on first additional wiring layer for power source 10d and first connection lands for power source $30L_{1d}$ on circuit board 2 are connected to each other by bonding wires 6. Likewise, arbitrary positions on first additional wiring layer for ground 10s and first connection lands for ground $30L_{1s}$ on circuit board 2 are connected to each other by bonding wires 6.

Figure 20:
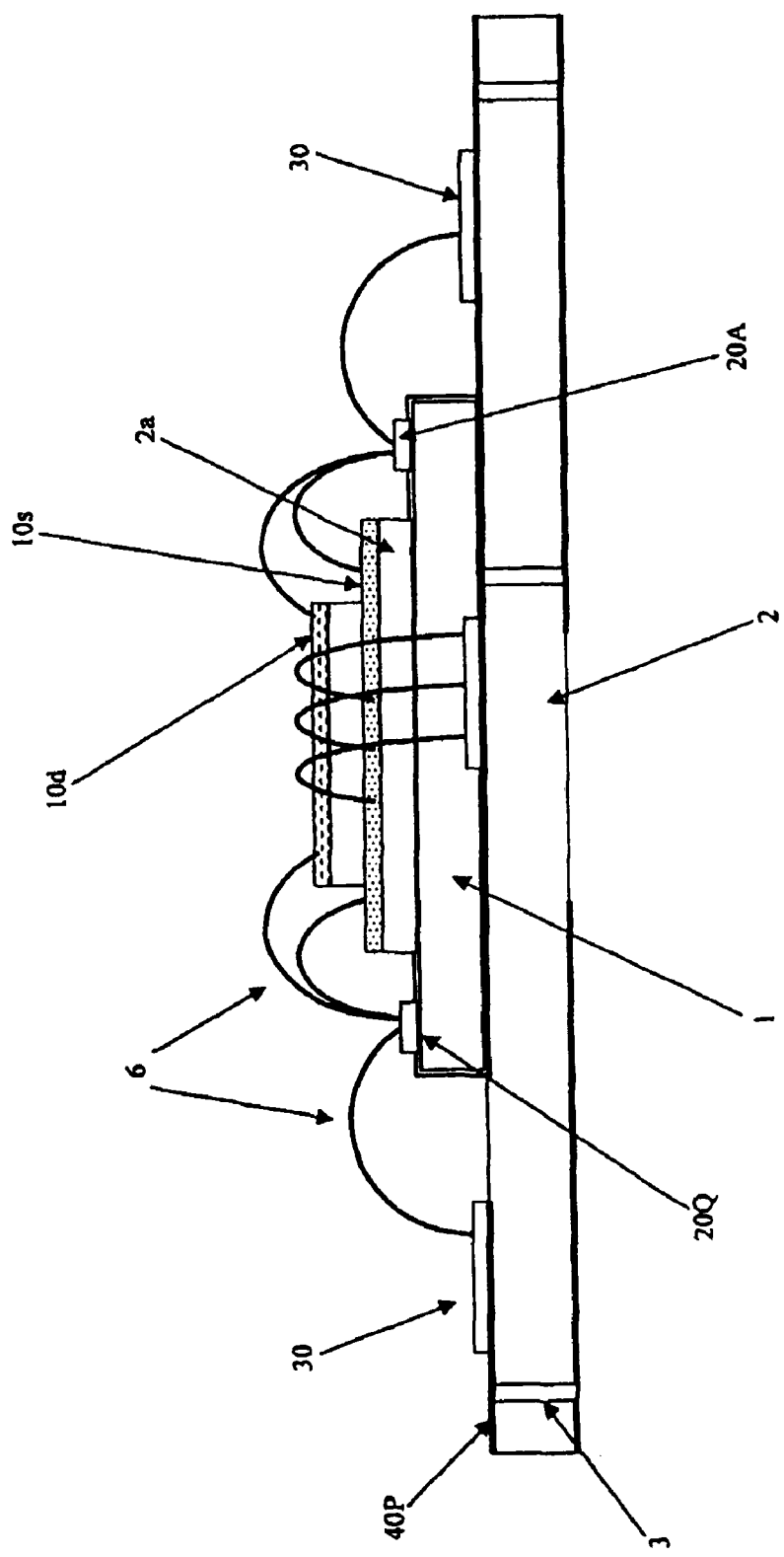
FIG. 20 is a diagram showing a status where the electrode pads (other than the first power and ground) and the connection lands on the circuit board are connected to each other by the bonding wires on the semiconductor chip shown in FIG. 19.

Next, as shown in FIG. 20, DQ system pad row 20Q and connection lands 30 (including connection land for DQ system signal $30L_{DQ}$, second connection land for power source $30L_{2d}$ and second connection land for ground $30L_{2s}$) are connected to each other by bonding wire 6. Likewise, CA system pad row 20A and connection lands 30 (including connection land for CA system signal $30L_{CA}$) are connected to each other by bonding wire 6.

Lastly, the side of circuit board 2 on which semiconductor chip 1 and additional wiring layers 10d and 10s are stacked is encapsulated with encapsulating resin 5 (molding), and solder balls (e.g., comprising Sn—Ag—Cu) to serve as external terminals 4 are formed on the side of circuit board 2 opposite to the side encapsulated with encapsulating resin 5. The semiconductor device according to the present invention as shown in FIG. 7 has thus been completed.

Second Exemplary Embodiment

Figure 22:
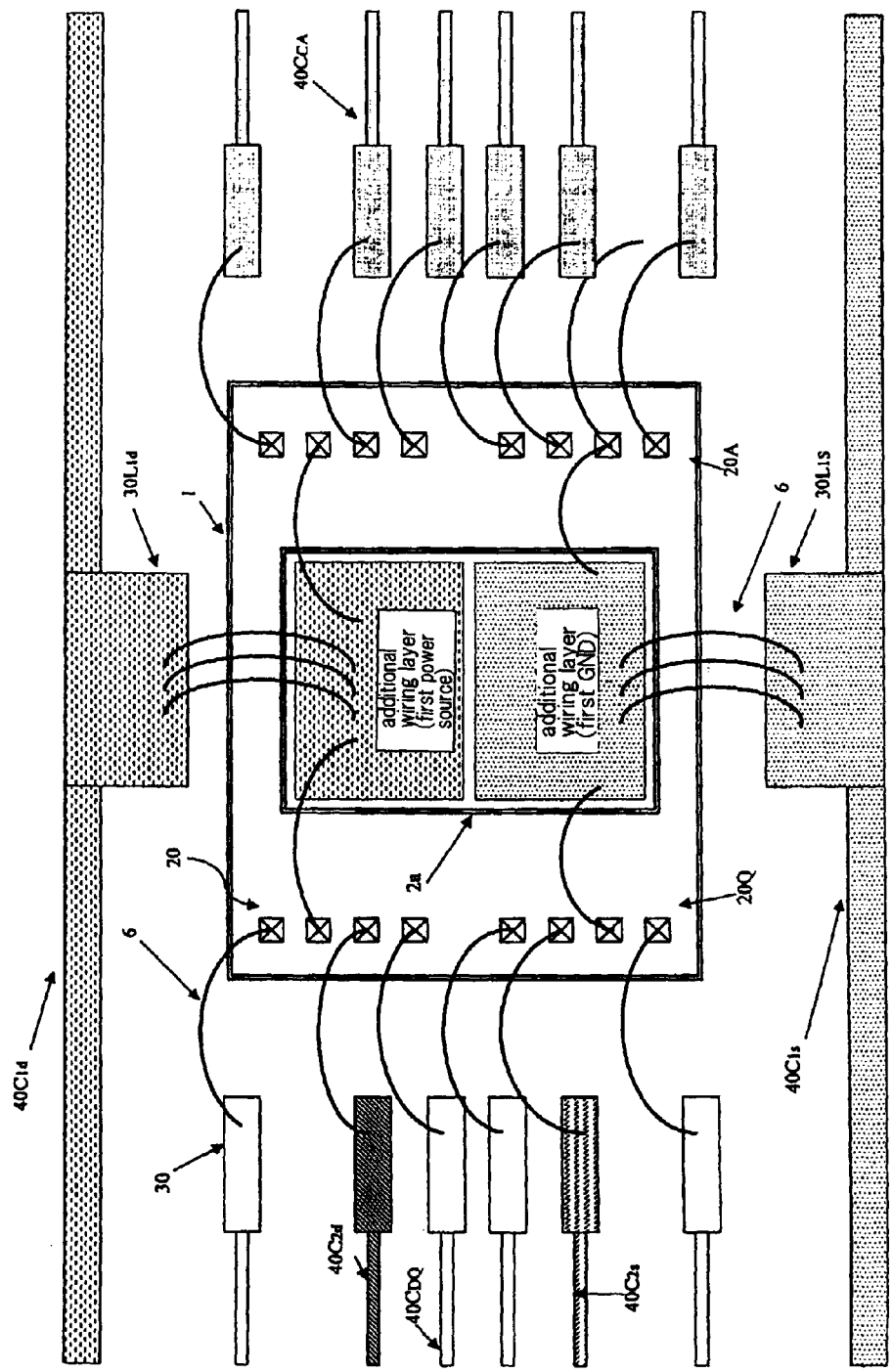
FIG. 22 is a schematic diagram showing a semiconductor chip of a semiconductor device according to another exemplary embodiment.
Figure 23:
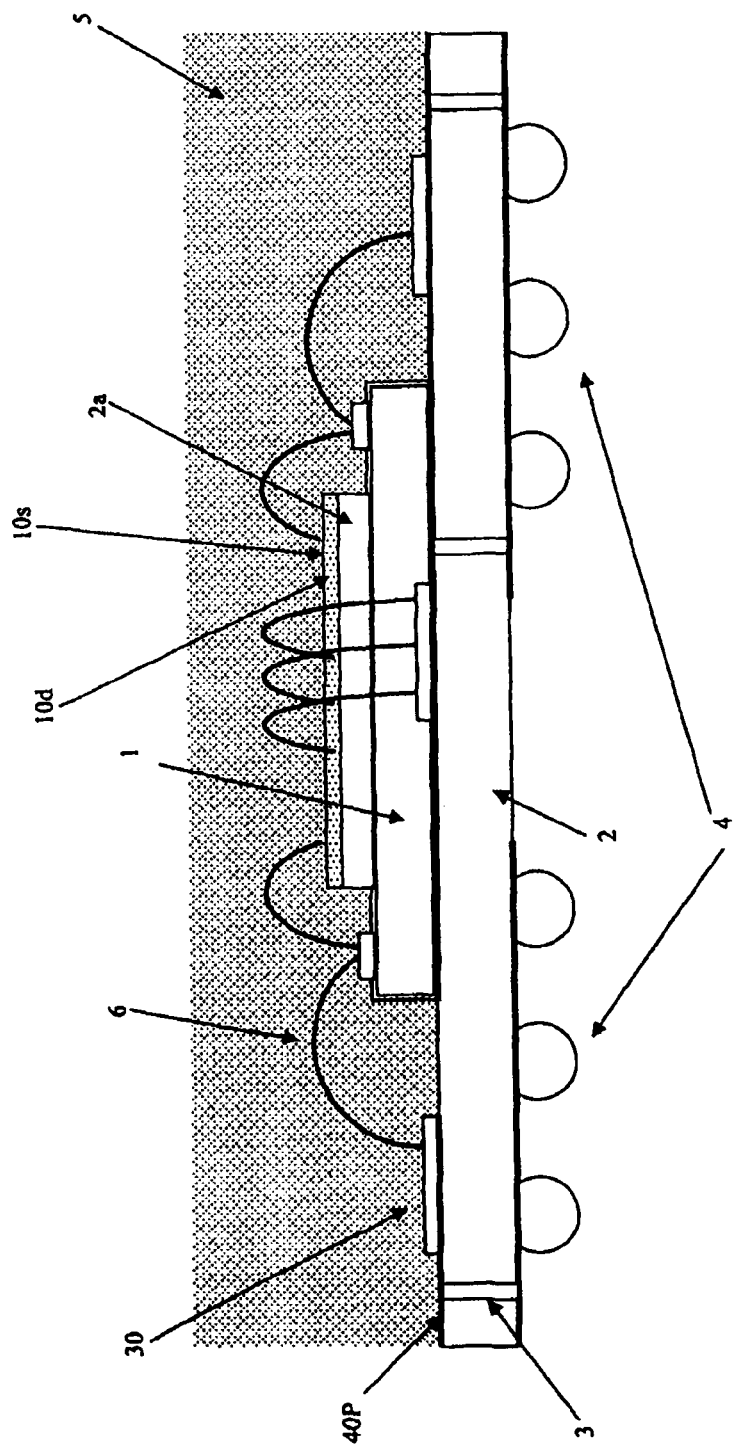
FIG. 23 is a longitudinal sectional view of the semiconductor device shown in FIG. 22.

Next, FIG. 22 shows a schematic view of semiconductor chip of a semiconductor device according to another exemplary embodiment. FIG. 23 shows a longitudinal sectional view of the semiconductor device shown in FIG. 22.

The semiconductor device according to the first embodiment shown in FIGS. 6 and 7 adopts the configuration where additional substrate 2a is provided on semiconductor chip 1 and additional substrate 2b is provided in a stacked manner on additional substrate 2a. In this configuration, first additional wiring layer for ground 10s is formed on the upper surface of additional substrate 2a, and first additional wiring layer for power source 10d is formed on additional substrate 2b. The semiconductor device according to the first exemplary embodiment thus adopts the configuration where the additional wiring layers are formed on the two stacked additional substrates, respectively.

On the other hand, in a configuration shown in FIGS. 22 and 23, first additional wiring layer for ground 10s and first additional wiring layer for power source 10d are formed in planar fashion on the upper surface of one additional substrate 2a. First additional wiring layer for ground 10s and first additional wiring layer for power source 10d are thus disposed on the same plane of semiconductor chip 1. First additional wiring layer for ground 10s is formed at a side near first connection land for ground $30L_{1s}$. First additional wiring layer for power source 10d is formed at a side near first connection land for power source $30L_{1d}$. Note that, since the configuration is similar to that of the semiconductor device according to the first exemplary embodiment, a detailed description is omitted.

Third Exemplary Embodiment

Figure 24:
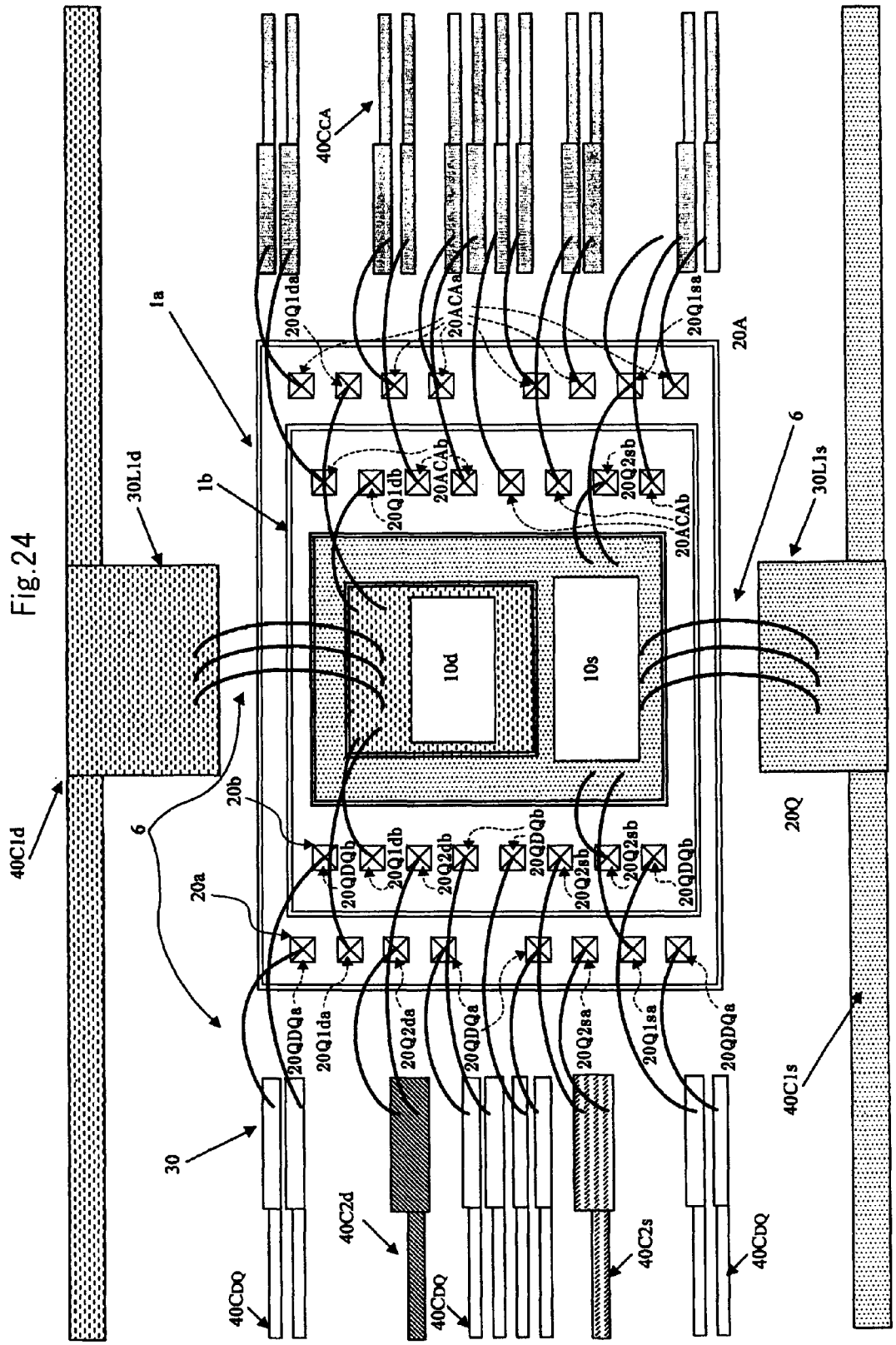
FIG. 24 is a schematic diagram showing a semiconductor chip and its peripherals of said semiconductor device according to a third exemplary embodiment of the present invention.
Figure 25:
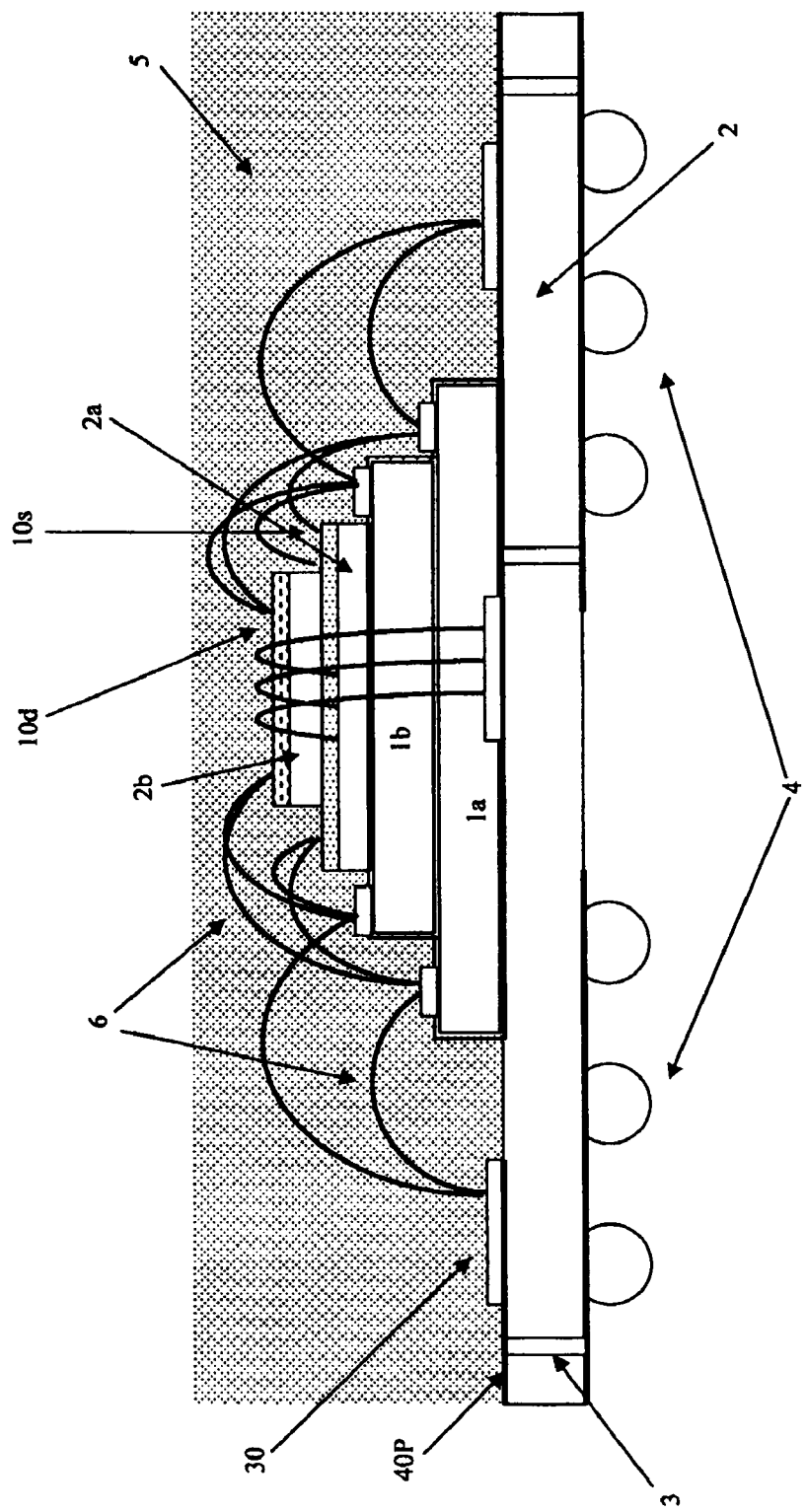
FIG. 25 is a longitudinal sectional view of the semiconductor device shown in FIG. 24.
Figure 26:
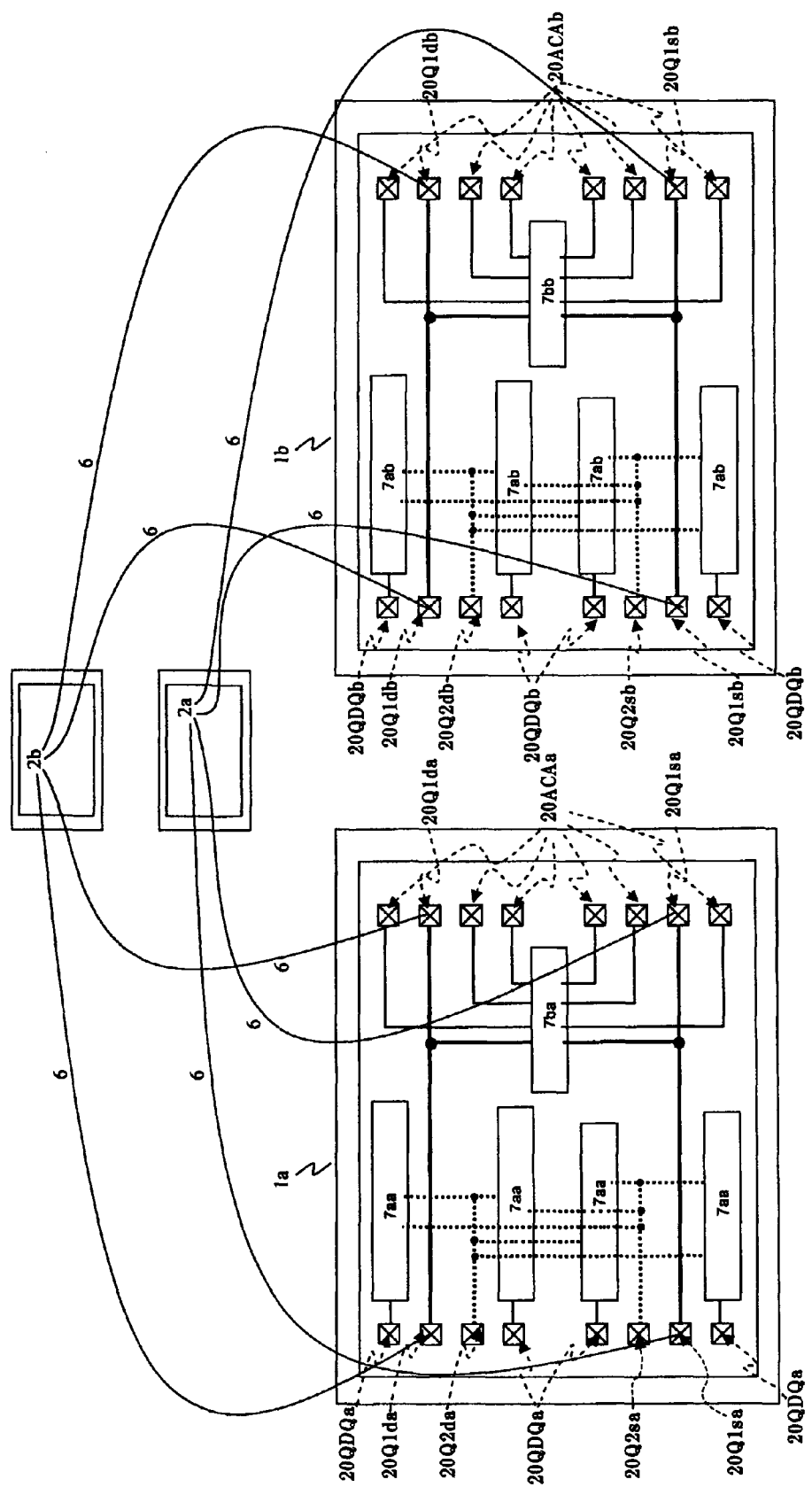
FIG. 26 is a block diagram showing a data output circuit and a circuit excluding the data output circuit of the semiconductor chip according to the third exemplary embodiment.

A configuration shown in FIGS. 24 to 26 is different in that second semiconductor chip 1b is provided between semiconductor chip 1 (first semiconductor chip 1a) and additional wiring substrate 2a compared to the semiconductor device of the first exemplary embodiment shown in FIGS. 6, 7 and 10. More specifically, in a semiconductor device of this exemplary embodiment, second semiconductor chip 1b is provided on first semiconductor chip 1a disposed on wiring substrate 2. Additional substrate 2a is provided on second semiconductor chip 1b. Additional substrate 2b is further provided stacked on this additional substrate 2a. First semiconductor chip 1a includes electrode pads 20a, as with the first exemplary embodiment. These electrode pads 20a include CA system signal pads 20ACAa connected to other circuit 7ba excluding data output circuits 7aa provided on semiconductor chip 1a, first power source pads 20Q1da supplying other circuit 7ba with a potential of one side of a first power source potential, first ground pads 20Q1sa supplying other circuit 7ba with a potential of the other side of the first power source potential, DQ system signal pads 20QDQa connected to respective data output circuits 7aa provided on first semiconductor chip 1a, second power source pads 20Q2da supplying data output circuits 7aa with a potential of one side of a power source voltage, and second ground pads 20Q2sa supplying data output circuits 7aa with the other side of the power source potential. Each of first power source pads 20Q1da is connected to first additional wiring layer for power source 10d on additional substrate 2b through corresponding bonding wire 6. Each of first ground pads 20Q1sa is connected to first additional wiring layer for ground 10s on additional substrate 2a through corresponding bonding wire 6. On the other hand, each of CA system signal pads 20ACAa is connected to corresponding CA system signal wiring 40CCA through corresponding connection land 30 provided on wiring substrate 2 using corresponding bonding wire 6. Each of DQ system signal pads 20QDQa is connected to corresponding DQ system signal wiring 40CDQ through corresponding connection land 30 provided on wiring substrate 2 using corresponding bonding wire 6. Second power source pad 20Q2da is connected to corresponding second power source wiring 40C2d through corresponding connection land 30 provided on wiring substrate 2 using corresponding bonding wire 6. Second ground pad 20Q2sa is connected to corresponding second ground wiring 40C2s through corresponding connection land 30 provided on wiring substrate 2 using corresponding bonding wire 6.

On the other hand, second semiconductor chip 1b includes data output circuit 7ab and other circuit 7bb excluding the data output circuit. Second semiconductor chip 1b includes electrode pads 20a. These electrode pads 20a include CA system signal pads 20ACAb connected to other circuit 7bb excluding data output circuits 7ab provided on semiconductor chip 1b, first power source pads 20Q1db supplying other circuit 7bb with the potential of one side of the first power source potential, first ground pads 20Q1sb supplying other circuit 7bb with the potential of the other side of the first power source potential, DQ system signal pads 20QDQb connected to respective data output circuits 7ab provided on second semiconductor chip 1b, second power source pads 20Q2db supplying data output circuits 7ab with the potential of one side of the power source voltage, and second ground pads 20Q2sb supplying data output circuits 7ab with the other side of the power source potential. Each of first power source pads 20Q1db is connected to first additional wiring layer for power source 10d on additional substrate 2b through corresponding bonding wire 6. Each of first ground pads 20Q1sb is connected to first additional wiring layer for ground 10s on additional substrate 2a through corresponding bonding wire 6. On the other hand, each of CA system signal pads 20ACAb is connected to corresponding CA system signal wiring 40CCA through corresponding connection land 30 provided on wiring substrate 2 using corresponding bonding wire 6. Each of DQ system signal pads 20QDQb is connected to corresponding DQ system signal wiring 40CDQ through corresponding connection land 30 provided on wiring substrate 2 using corresponding bonding wire 6. Second power source pad 20Q2db is connected to corresponding second power source wiring 40C2d through corresponding connection land 30 provided on wiring substrate 2 using corresponding bonding wire 6. Second ground pad 20Q2sb is connected to corresponding second ground wiring 40C2s through corresponding connection land 30 provided on wiring substrate 2 using corresponding bonding wire 6.

Note that, in FIGS. 24 and 25, the present invention is applied to both first semiconductor chip 1a and second semiconductor chip 1b. Instead, it may be configured such that the present invention is only applied to any one of the semiconductor chips. For example, a DRAM may be used for first semiconductor chip 1a; a logic, a flash memory or the like may be used for second semiconductor chip 1b.

Fourth Exemplary Embodiment

According to a configuration shown in FIG. 27, third semiconductor chip 1c, which is a flip chip, is mounted between wiring substrate 2 and first semiconductor chip 1a of the first exemplary embodiment. In FIG. 27, semiconductor chip 1c is connected to wiring pattern 40P on wiring substrate 2 using bump 50 (ex. including solder). On the other hand, in FIG. 26, first semiconductor chip 1a is connected to additional wiring layers (10d and 10s) on additional substrate (2a and 2b) and connection lands 30 on wiring substrate 2 using bonding wire 6, as with the first exemplary embodiment. In FIG. 27, a DRAM may be used for first semiconductor chip 1a, and an RF chip or the like may be used for second semiconductor chip 1b.

Although a DRAM is exemplified as the semiconductor device in the above description, the present invention is not limited to this. For example, the present invention can be applied to a logic circuit where a data output circuit and the circuit are separately supplied with respective power sources.

It is apparent that the present invention is not limited to the above embodiments, but may be modified and changed without departing from the scope and spirit of the invention.

What is claimed is:

1. A device, comprising:
a package substrate comprising a first power supply terminal, a second power supply terminal, a signal terminal, and a plurality of conductive layers;
a first semiconductor chip located above the package substrate, and the semiconductor chip comprising a first circuit operating on a first power supply voltage, a second circuit operating on a second power supply voltage and generating an output signal, a first pad supplying the first circuit with a first power supply potential as one of potentials of the first power supply voltage and a second pad supplying the second circuit with a second power supply potential as one of potentials of the second power supply voltage, a signal pad receiving the output signal from the second circuit;
a first additional substrate located above the first semiconductor chip, the first additional substrate comprising a first wiring layer formed on an opposite side to the first semiconductor chip;
a first power supply path electrically connecting the first power supply terminal of the package substrate to the first wiring layer of the first additional substrate;
a second power supply path electrically connecting the first wiring layer of the first additional substrate to the first pad of the first semiconductor chip, the second conductive path being free from including any one of the conductive layers of the package substrate between the first wiring layer of the first additional substrate and the first pad of the first semiconductor chip;
a third power supply path electrically connecting the second power supply terminal of the package substrate to the second pad of the first semiconductor chip; and
a signal path electrically connecting the signal terminal of the package substrate to the signal pad of the first semiconductor chip.

2. The device according to claim 1, wherein the signal path is elongated in parallel to the third power supply path.

3. The device according to claim 1, wherein the package substrate comprises third and fourth power supply terminals, the first semiconductor chip comprises a third pad supplying the first circuit with a first ground potential as the other of the potentials of the first power supply voltage and a fourth pad supplying the second circuit with a second ground potential as the other of the potentials of the second power supply voltage, and the device further comprises:
a second additional substrate located above the first semiconductor chip, the second additional substrate comprises a second wiring layer formed on an opposite side to the first semiconductor chip;
a fifth power supply path electrically connecting the third power supply terminal of the package substrate to the second wiring layer of the second additional substrate;
a sixth power supply path electrically connecting the second wiring layer of the second additional substrate to the third pad of the first semiconductor chip, the sixth conductive path being free from including any one of the conductive layers of the package substrate between the second wiring layer of the second additional substrate and the third pad of the first semiconductor chip; and
a seventh power supply path electrically connecting the fourth power supply terminal of the package substrate to the fourth pad of the first semiconductor chip.

4. The device according to claim 3, wherein the second additional substrate is mounted on the first additional substrate at the opposite side to the first semiconductor chip of the first additional substrate.

5. The device according to claim 3, wherein the first additional substrate and the second additional substrate are mounted on the first semiconductor chip and arranged adjacently to and separately from each other.

6. A device, comprising:
a package substrate including first, second, and third connection lands formed on a first surface thereof and a plurality of conductive layers, the first and second connection lands being supplied respectively with a first and second power voltages;
a semiconductor chip mounted on the first surface of the package substrate and including first and second power supply pads, a peripheral circuit, a memory cell array and an output circuit, the peripheral circuit and the memory cell array operating on the first power voltage supplied through the first power supply pad, the output circuit operating on the second power voltage supplied through the second power supply pad and generating an output signal, and an output pad receiving the output signal from the output circuit;

a first additional substrate mounted on the semiconductor chip and including a first conductive layer;
a first power supply wiring connecting the first connection land of the package substrate to the first conductive layer of the first additional substrate so that the first conductive layer of the first additional substrate is supplied with the first power supply voltage;
a second power supply wiring connecting the first conductive layer of the first additional substrate to the first power supply pad of the semiconductor chip so that the first power supply pad of the semiconductor chip is supplied with the first power voltage without an interventions of any one of the conductive layers of the package substrate between the first conductive layer of the first additional substrate and the first power supply pad of the semiconductor chip;
a third power supply wiring connecting the second power supply pad of the semiconductor chip to the second connection land of the package substrate so that the second power supply pad of the semiconductor chip is supplied with the second power voltage, and the second power supply pad being free from connecting the first conductive layer of the first additional substrate; and
a signal wiring connecting the output pad of the semiconductor chip to the third connection land of the package substrate so that the output pad of the semiconductor chip supplies the output signal to the third connection land of the package substrate.

7. The device according to claim 6, wherein the first power supply pad is free from connecting to the first connection lands.

8. The device according to claim 6, wherein the package substrate includes fourth and fifth connection lands formed on the first surface thereof, the fourth and fifth connection lands being supplied respectively with a first and second ground voltage,
wherein the semiconductor chip includes first and second ground pads, the peripheral circuit and the memory cell array operating on the first ground voltage supplied through the first ground pad, and the output circuit operating on the second ground voltage supplied through the second ground pad, and the device further comprises:
a second additional substrate mounted on the semiconductor chip and including a second conductive layer on a third surface thereof;
a fourth power supply wiring connecting the third fourth connection land of the package substrate to the second conductive layer of the second additional substrate so that the second conductive layer of the second additional substrate is supplied with the first ground voltage;
a fifth power supply wiring connecting the second conductive layer of the second additional substrate to the first ground pad of the semiconductor chip so that the first ground pad of the semiconductor chip is supplied with the first ground voltage without an intervention of any one of the conductive layers of the package substrate between the second conductive layer of the second additional substrate and the first ground pad of the semiconductor chip; and
a sixth wiring connecting the second ground pad of the semiconductor chip to the fifth connection land of the package substrate so that the second ground pad of the semiconductor chip is supplied with the second ground voltage, and the second ground pad being free from connecting the second conductive layer of the second additional substrate.

9. The device according to claim 8, wherein the first power supply pad of the semiconductor chip is free from connecting to the first connection lands and the first ground pad of the semiconductor chip is free from connection to the third connection land.

10. The device according to claim 6, wherein the third power supply wiring and the signal wiring are elongated in parallel to each other.

11. A device, comprising:
a package substrate comprising a first power supply terminal and a second power supply terminal and a signal terminal;
a first semiconductor chip located above the package substrate, and the semiconductor chip comprising a first circuit operating on a first power supply voltage, a second circuit operating on a second power supply voltage and generating an output signal, a first pad supplying the first circuit with a first power supply potential as one of potentials of the first power supply voltage and a second pad supplying the second circuit with a second power supply potential as one of potentials of the second power supply voltage, a signal pad receiving the output signal from the second circuit;
a first additional substrate located above the first semiconductor chip, the first additional substrate comprising a first wiring layer formed on an opposite side to the first semiconductor chip, the first wiring layer including a first connection portion and a second connection portion that is continuous with the first connection portion;
a first power supply path comprising a first end portion that is in contact with the first power supply terminal of the package substrate and a second end portion that is in contact with the first connection portion of the first wiring layer of the first additional substrate;
a second power supply path comprising a third end portion that is in contact with the first pad of the first semiconductor chip and a fourth end portion that is in contact with the second connection portion of the first wiring layer of the first additional substrate;
a third power supply path comprising a fifth end portion that is in contact with the second power supply terminal of the package substrate and sixth end portion that is in contact with the second pad of the first semiconductor chip; and
a signal path comprising a seventh end portion that is in contact with the signal terminal of the package substrate and an eighth end portion that is in contact with the signal pad of the first semiconductor chip.

12. The device according to claim 11, wherein the signal path is elongated in parallel to the third power supply path.

13. The device according to claim 11,
wherein the package substrate comprises third and fourth power supply terminals, the first semiconductor chip comprises a third pad supplying the first circuit with a first ground potential as the other of the potentials of the first power supply voltage and a fourth pad supplying the second circuit with a second ground potential as the other of the potentials of the second power supply voltage, and
wherein the device further comprises:
a second additional substrate located above the first semiconductor chip, the second additional substrate comprises a second wiring layer formed on an opposite side to the first semiconductor chip, the second wiring layer including a third connection portion and a fourth connection portion that is continuous with the third connection portion;

a fourth power supply path comprising a ninth end portion that is in contact with the third power supply terminal of the package substrate and a tenth end portion that is in contact with the third connection portion of the second wiring layer of the second additional substrate;

a fifth power supply path comprising an eleventh end portion that is in contact with the third pad of the first semiconductor chip and a twelfth end portion that is in contact with the fourth connection portion of the second wiring layer of the second additional substrate; and a sixth power supply path comprising a thirteenth end portion that is in contact with the fourth power supply terminal of the package substrate and fourteenth end portion that is in contact with the fourth pad of the first semiconductor chip.

14. The device according to claim 13, wherein the second additional substrate is mounted on the first additional substrate at the opposite side to the first semiconductor chip of the first additional substrate.

15. The device according to claim 13, wherein the first and second substrate is mounted on the first semiconductor chip and arranged adjacently to and separately from each other.

* * * * *